United States Patent
Xu et al.

(10) Patent No.: US 12,273,112 B2
(45) Date of Patent: Apr. 8, 2025

(54) CLOCK SENDING APPARATUS AND METHOD, AND CLOCK RECEIVING APPARATUS AND METHOD

(71) Applicant: ZTE CORPORATION, Shenzhen (CN)

(72) Inventors: Boxiong Xu, Shenzhen (CN); Tongtong Guan, Shenzhen (CN); Fuqian Zeng, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 394 days.

(21) Appl. No.: 17/904,727

(22) PCT Filed: Jun. 23, 2021

(86) PCT No.: PCT/CN2021/101821
§ 371 (c)(1),
(2) Date: Aug. 22, 2022

(87) PCT Pub. No.: WO2021/259324
PCT Pub. Date: Oct. 30, 2021

(65) Prior Publication Data
US 2023/0079791 A1  Mar. 16, 2023

(30) Foreign Application Priority Data
Jun. 24, 2020  (CN) .................. 202010591351.X

(51) Int. Cl.
*G06F 1/08* (2006.01)
*H03K 5/00* (2006.01)
(Continued)

(52) U.S. Cl.
CPC ........... *H03K 5/00006* (2013.01); *G06F 1/08* (2013.01); *H04B 14/026* (2013.01); *H04B 14/04* (2013.01)

(58) Field of Classification Search
CPC ................................. G06F 1/12; G06F 1/10
See application file for complete search history.

(56) References Cited

U.S. PATENT DOCUMENTS

| | | | |
|---|---|---|---|
| 9,503,115 B1 * | 11/2016 | Shin | H03M 1/0836 |
| 11,126,218 B2 * | 9/2021 | Baidas | G06F 13/4221 |
| 2006/0214708 A1 * | 9/2006 | Huang | G06F 1/04 |
| | | | 327/156 |
| 2008/0068355 A1 * | 3/2008 | Chen | G06F 1/10 |
| | | | 345/204 |

(Continued)

FOREIGN PATENT DOCUMENTS

| | | |
|---|---|---|
| CN | 1852508 A | 10/2006 |
| CN | 102522987 A | 6/2012 |

(Continued)

OTHER PUBLICATIONS

European Patent Office. Extended European Search Report for EP Application No. 21829474.2, mailed Sep. 22, 2023, pp. 1-9.

(Continued)

*Primary Examiner* — Phil K Nguyen
(74) *Attorney, Agent, or Firm* — Vivacqua Crane, PLLC

(57) ABSTRACT

A clock sending apparatus and method, and a clock receiving apparatus and method are disclosed. The clock sending apparatus may include, an input unit configured to input a first and second input clocks; a sampling unit configured to acquire a first and second sampling clocks, and determine a first frequency control word according to the first and second sampling clocks, the first frequency control word is indicative of a relationship between the first and second sampling clocks, the first sampling clock is determined by the first input clock according to a preset rule, and the second sampling clock is determined by the second input clock according to a preset rule; and a sending unit configured to generate a clock signal according to the first input clock and send the clock signal that carries at least the first frequency control word to a receiving side.

19 Claims, 11 Drawing Sheets

(51) Int. Cl.
*H04B 14/02* (2006.01)
*H04B 14/04* (2006.01)

(56) References Cited

U.S. PATENT DOCUMENTS

| | | | | |
|---|---|---|---|---|
| 2008/0122977 | A1 | 5/2008 | Miyamoto | |
| 2009/0202030 | A1* | 8/2009 | Hsieh | G06F 1/10 375/371 |
| 2015/0200766 | A1* | 7/2015 | Zhang | H04L 7/0033 375/355 |
| 2017/0038738 | A1* | 2/2017 | Zhou | G04F 10/005 |
| 2017/0222796 | A1* | 8/2017 | Chen | H04L 7/0337 |
| 2020/0033909 | A1* | 1/2020 | Rupert | G06F 1/10 |
| 2020/0285265 | A1* | 9/2020 | Ranganathan | G06F 1/12 |
| 2023/0051554 | A1* | 2/2023 | Arora | H03K 19/20 |
| 2024/0072776 | A1* | 2/2024 | Shao | G06F 7/588 |

FOREIGN PATENT DOCUMENTS

| | | |
|---|---|---|
| CN | 102739202 A | 10/2012 |
| CN | 103023507 A | 4/2013 |
| CN | 104868912 A | 8/2015 |
| EP | 3599736 A1 | 1/2020 |
| JP | 2016039396 A | 3/2016 |

OTHER PUBLICATIONS

Japan Patent Office. Notice of Reasons for Refusal for JP Application No. 2022-550187 and English translation, mailed Aug. 30, 2023, pp. 1-11.
Japan Patent Office. Second Notice of Reasons for Refusal for JP Application No. 2022-550187 and English translation, mailed Feb. 8, 2024, pp. 1-8.
Korean Intellectual Property Office. First Office Action for KR Application No. 10-2022-7029175 and English translation, mailed Aug. 28, 2024, pp. 1-15.
International Searching Authority. International Search Report and Written Opinion for PCT Application No. PCT/CN2021/101821 and English translation, mailed Sep. 27, 2021, pp. 1-12.
ZTE Technology Journal. "High-Speed PAM4 Clock and Data Recovery Techniques for 5G Communications," vol. 24, No. 4, Aug. 2018, pp. 21-26.

* cited by examiner

FMU*: Frequency Multiplication Unit
FMSU*: Frequency Multiplication Subunit

CLOCK SENDING APPARATUS AND METHOD, AND CLOCK RECEIVING APPARATUS AND METHOD

CROSS-REFERENCE TO RELATED APPLICATION

This application is a national stage filing under 35 U.S.C. § 371 of international application number PCT/CN2021/101821, filed Jun. 23, 2021, which claims priority to Chinese patent application No. 202010591351.X, filed Jun. 24, 2020. The contents of these applications are incorporated herein by reference in their entirety.

TECHNICAL FIELD

The present disclosure relates to the field of communication, and in particular relates to an apparatus, a method for sending a clock, and an apparatus, a method for receiving a clock.

BACKGROUND

With the continuous increasing of network throughput, more and more types of service cards and rack slots are increasingly provided in communication equipment such as high-capacity switches and routers. Clock distributions corresponding to various services are indispensable to communication equipment. Generally, communication equipment tends to receive various amounts of clocks from various frequency sources externally. For example, for a 20-slot system, a total of 40 lines shall be arranged for the uplink and downlink of clocks. The total amount of the lines would increase to 80 in case that two types of clocks from different frequency sources for sending and returning are provided in the system. On this basis, the total amount of the lines would even increase to 160 for differential routing. With the increase of the amount of clocks from different frequency sources in each slot, the amount of lines corresponding to the clocks will increase exponentially.

Moreover, the wiring of the lines usually extends for tens of centimeters in communication equipment, and more than one meter for some large-scale communication equipment. With the design concept of miniaturization, integration and low cost of communication equipment, the space of backplane for wiring in communication equipment is extremely limited, so it is challenging to arrange a large amount of clock lines with considerable length within the backplane with extremely limited space.

In view of the foregoing, the layout of clock lines for clock distribution in communication equipment is complicated and ineffective, while limited solutions are proposed for the above.

SUMMARY

An apparatus, a method for sending a clock, and an apparatus, a method for receiving a clock are provided in various embodiments of the present disclosure.

According to an embodiment of the present disclosure, there is provided an apparatus for sending a clock, which may include, an input unit configured to input a first input clock and a second input clock; a sampling unit configured to acquire a first sampling clock and a second sampling clock, and determine a first frequency control word according to the first sampling clock and the second sampling clock; in which, the first frequency control word is indicative of a relationship between the first sampling clock and the second sampling clock, the first sampling clock is determined by the first input clock according to a preset rule, and the second sampling clock is determined by the second input clock according to a preset rule; and a sending unit configured to generate a clock signal according to the first input clock and send the clock signal to a receiving side, in which the clock signal carries at least the first frequency control word.

According to another embodiment of the present disclosure, there is further provided an apparatus for receiving a clock, which may include, a receiving unit configured to receive a clock signal sent by a sending side, in which, the clock signal is generated according to a first input clock from the sending side, and the clock signal carries at least a first frequency control word which is indicative of a relationship between a first sampling clock and a second sampling clock, the first sampling clock is determined by the first input clock according to a preset rule, and the second sampling clock is determined by a second input clock of the sending side according to a preset rule; the receiving unit is further configured to determine the first input clock and the first frequency control word according to the clock signal; and a recovery unit configured to determine the second input clock according to the first input clock and the first frequency control word.

According to yet another embodiment of the present disclosure, there is further provided a clock transmission system, which may include an input unit configured to input a first input clock and a second input clock; a sampling unit configured to acquire a first sampling clock and a second sampling clock, and determine a first frequency control word according to the first sampling clock and the second sampling clock; in which the first frequency control word is indicative of a relationship between the first sampling clock and the second sampling clock, the first sampling clock is determined by the first input clock according to a preset rule, and the second sampling clock is determined by the second input clock according to a preset rule; a sending unit configured to generate a clock signal according to the first input clock and send the clock signal to a receiving side; in which the clock signal carries at least the first frequency control word; a receiving unit configured to receive the clock signal and determine the first input clock and the first frequency control word according to the clock signal; and a recovery unit configured to determine the second input clock according to the first input clock and the first frequency control word.

According to yet another embodiment of the present disclosure, there is further provided a method for sending a clock, performed by a sending side, the method may include, inputting a first input clock and a second input clock; acquiring, a first sampling clock according to the first input clock, and a second sampling clock according to the second input clock, and determining a first frequency control word according to the first sampling clock and the second sampling clock, in which the first frequency control word is indicative of the relationship between the first sampling clock and the second sampling clock; generating a clock signal according to the first input clock, and sending the clock signal to a receiving side; in which the clock signal carries at least the first frequency control word.

According to yet another embodiment of the present disclosure, there is further provided a method for receiving a clock, performed by a receiving side, the method may include, receiving a clock signal sent by a sending side, in which the clock signal is generated according to a first input clock from the sending side, and the clock signal carries at least a first frequency control word which is indicative of a relationship between a first sampling clock and a second sampling clock, the first sampling clock is determined by the first input clock according to a preset rule, and the second sampling clock is determined by the second input clock of the sending side according to a preset rule; determining the first input clock and the first frequency control word according to the clock signal; and determining the second input clock according to the first input clock and the first frequency control word.

According to yet another embodiment of the present disclosure, there is further provided a non-transitory computer-readable storage medium storing a computer program, which when executed by a processor, causes the processor to carry out the method of any one of the methods as described above.

According to yet another embodiment of the present disclosure, there is further provided an electronic device, which may include a processor and a memory storing a computer program, which when executed by a processor, causes the processor to carry out the method of any one of the methods as described above.

DETAILED DESCRIPTION

Various embodiments of the present disclosure will be described in detail with reference to the drawings and examples in the following.

It should be noted that the terms "first" and "second", if used in the description and the drawings are intended to distinguish similar objects, and does not necessarily imply any specific order or sequence.

Several applications for the apparatus and method for sending/receiving a clock are described in the following to further illustrate the apparatus and method provided in various embodiments of the present disclosure.

Figure 1:
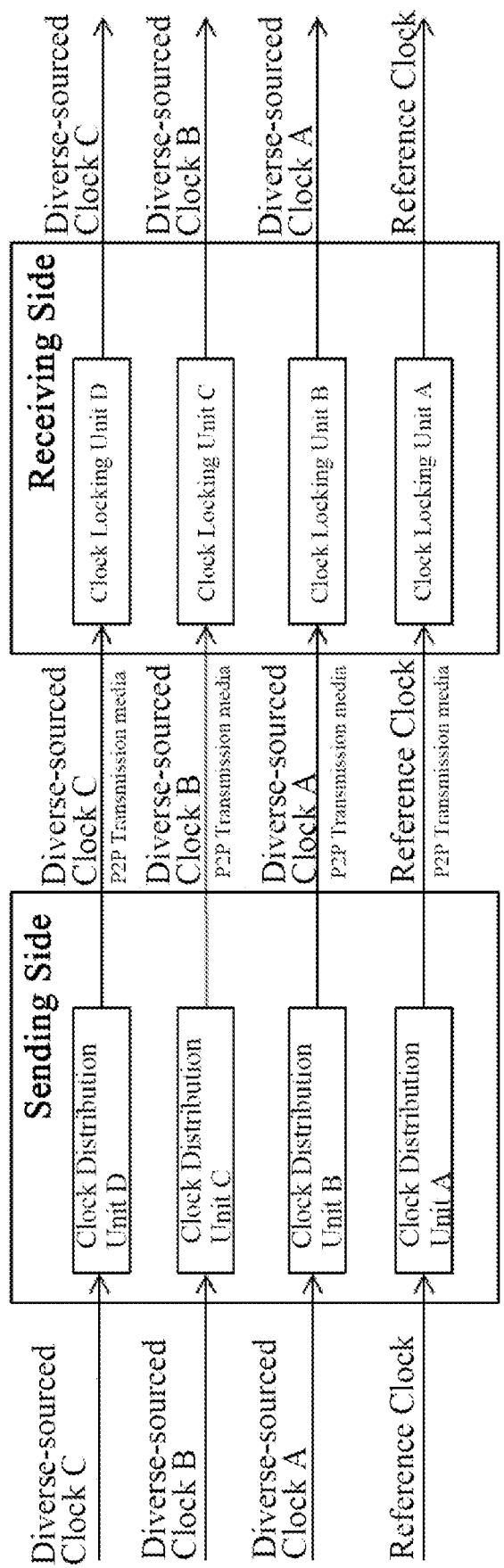
FIG. 1 depicts a schematic diagram showing connections for clock distribution according to some cases in the art.

FIG. 1 depicts a schematic diagram showing connections for clock distribution according to some cases in the art. As shown in FIG. 1, in some cases in the art, clock lines corresponding to diverse-sourced clocks (the clocks have different sources) are to be connected point-to-point, that is, each diverse-sourced clock is sent via a respective one clock line exclusively. The sending module transmits the clock to the receiving module of the clock board or service board via an uplink or a downlink, so that the receiving module can respectively lock and recover the corresponding one of the diverse-sourced clocks.

For the layout of clock lines as described above, each of the clock signals from different frequency sources takes up one point-to-point (P2P) physical transmission medium exclusively. However, when the clock signals from different frequency sources are transmitted via one physical link, that is, when two or more clock signals are multiplexed, it is not possible for the receiving module to lock all frequency sources. Therefore, for some cases in the art, the transmission of diverse-sourced clocks in the same line is not possible. Therefore, in some cases in this field, diverse-sourced clocks shall take up additional wiring space of Printed Circuit Board (PCB) in the backplane of communication equipment, connector pin allocation space, etc., so that in the process of wiring clock lines for signals from more than two frequency sources, it is necessary to increase the number of wirings, PCB layers, and connectors, which leads to the issues of wiring of the above clock lines in the current miniaturized backplane.

In view of this, an apparatus, and a method for sending/receiving a clock are provided in various embodiments of the present disclosure, so as to realize the transmission of clocks from different frequency sources between the sending side and the receiving side through the same clock line. The apparatus for sending a clock and the apparatus for receiving a clock in some embodiments of the present disclosure are respectively configured as the sending side and the receiving side in the clock distribution in communication equipment. In the following part, the apparatus and method for sending/receiving a clock according to some embodiments of the present disclosure will be illustrated.

Figure 2:
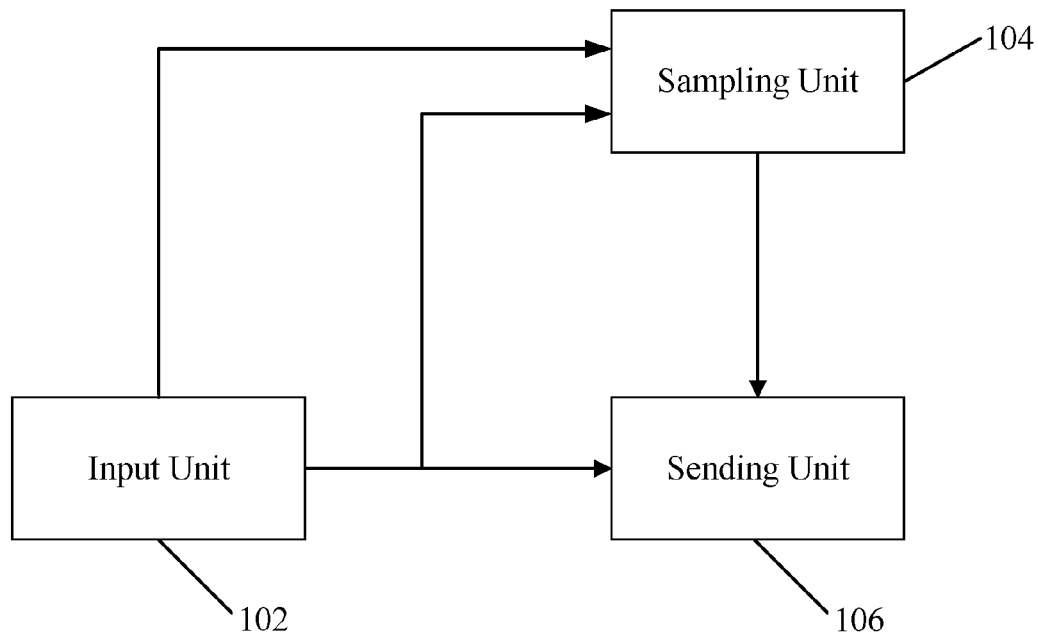
FIG. 2 depicts a schematic diagram (1) showing the apparatus for sending a clock according to the embodiment of the present disclosure.

An embodiment of the present disclosure provides an apparatus for sending a clock. FIG. 2 depicts a schematic diagram (1) showing the apparatus for sending a clock according to the embodiment of the present disclosure. As shown in FIG. 2, the apparatus in the embodiment of the present disclosure includes an input unit 102, a sampling unit 104, and a sending unit 106.

The input unit 102 is configured to input a first input clock and a second input clock.

The sampling unit 104 is configured to acquire a first sampling clock and a second sampling clock, and determine a first frequency control word according to the first sampling clock and the second sampling clock; in which the first frequency control word is indicative of the relationship between the first sampling clock and the second sampling clock, the first sampling clock is determined by the first input clock according to a preset rule, and the second sampling clock is determined by the second input clock according to a preset rule.

The sending unit 106 is configured to generate a clock signal according to the first input clock and send the clock signal to the receiving side, in which the clock signal carries at least the first frequency control word.

In this embodiment of the present disclosure, the input unit may be implemented as an input port, and the first input clock and the second input clock input by the input unit may be same-sourced clocks or diverse-sourced clocks. In an example, the first input clock and the second input clock are diverse-sourced clocks, which example will be described below.

Figure 3:
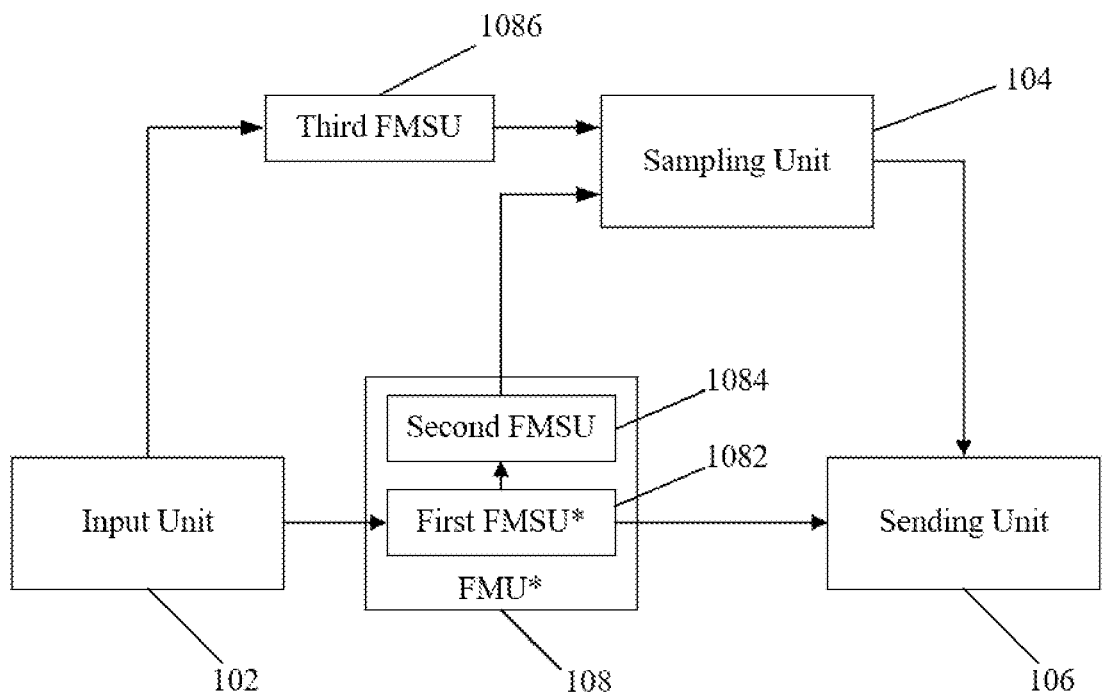
FIG. 3 depicts a schematic diagram (2) showing an apparatus for sending a clock according to another embodiment of the present disclosure.

Once the first and second input clocks clock are simultaneously input to the input unit of the apparatus for sending a clock, the first and second sampling clocks can be determined by the first and second input clocks according to the preset rule. It should be noted that the same preset rule may be applied for the first and second input clocks, or different reset rules may be applied for the first and second input clocks respectively. In an example, frequency multiplication may be performed on the first input clock to generate the first sampling clock that is transmitted to the sampling unit, and the second input clock may be directly transmitted to the sampling unit as the second sampling clock with no processing. Alternatively, frequency multiplication may be performed on the first input clock and the second input clock respectively with different multiples to generate the first sampling clock and the second sampling clock. FIG. 3 depicts a schematic diagram (2) showing an apparatus for sending a clock according to another embodiment of the present disclosure. As shown in FIG. 3, the apparatus for sending a clock in the embodiment of the present disclosure may further include a frequency multiplication unit 108.

The frequency multiplication unit 108 is configured to perform a frequency multiplication on the first input clock according to a preset first multiple to generate a first sampling clock, in which a ratio of a clock frequency of the first sampling clock to that of the second sampling clock is within a preset range.

It should be noted that the frequency multiplication unit may multiply the frequency of the first input clock such that, the ratio of the clock frequency of the first sampling clock to that of the second sampling clock is within the preset range, so that the sampling or determination time of the sampling unit can be controlled during the determination of the first frequency control word, thereby improving the processing efficiency of the apparatus for sending a clock in various embodiments of the present disclosure. Those having ordinary skills in the art can select the multiple for frequency multiplication for the frequency multiplication unit according to the practical clock frequencies of the first and second input clocks, such as the above-mentioned first multiple, and it is not intended to limit this in the present disclosure.

In an embodiment, the frequency multiplication unit 108 may further include a first frequency multiplication subunit 1082 and a second frequency multiplication subunit 1084.

The first frequency multiplication subunit 1082 is configured to multiply the frequency of the first input clock according to a preset second multiple to generate a first sending clock for the sending unit to generate a clock signal according to the first sending clock.

The second frequency multiplication subunit 1084 is configured to multiply the frequency of the first sending clock according to a preset third multiple to generate the first sampling clock.

Through the first and second frequency multiplication subunits, the first input clock is subjected to first frequency multiplication by the first frequency multiplication subunit to obtain a first sending clock which is sent to the sending unit to generate a clock signal, while the first sending clock is subjected to second frequency multiplication by the second frequency multiplication subunit to obtain a first sampling clock.

On the other hand, in case that the frequency of the second input clock is low, such as 1001 Hz, 4002 Hz, 8003 Hz, etc., it is not possible to accurately decide or count the second clock with low-frequency during the sampling or determination by the sampling unit if the low-frequency second input clock is directly utilized as the second sampling clock, resulting in errors. Therefore, the frequency multiplication unit in an embodiment of the present disclosure may further include a third frequency multiplication unit 1086 configured to multiply the second input clock according to a preset fourth multiple to obtain a second sampling clock.

It should be noted that the frequency multiplication unit in various embodiments of the present disclosure, including the first frequency multiplication subunit, the second frequency multiplication subunit and the third frequency multiplication subunit, may be implemented as a frequency multiplication device or multiplication means such as a pulse compensation gate, a phase-locked loop or a Voltage Controlled Oscillator (VCO), and it is not intended to limit this in the present disclosure. And it is known to those having ordinary skills in the art how to multiply the frequency of a clock with a fixed frequency, and which will not be described here.

In various embodiments of the present disclosure, the first frequency control word may indicate the relationship between the first sampling clock and the second sampling clock in various manners. In an example, the first frequency control word may indicate the ratio of the clock frequency of the first sampling clock to that of the second sampling clock, or indicate the difference between the clock frequencies of the first and second sampling clocks. It should be noted that the above ratio or difference is described to illustrate the relationship between the first sampling clock and the second sampling clock indicated by the first frequency control word merely, and any parameter or mathematical relationship that is indicative of the relationship between the first and second sampling clocks can be utilized as the first frequency control word in various embodiments of the present disclosure.

During the determination of the first frequency control word, the sampling unit in an embodiment of the present disclosure may determine the first frequency control word by sampling the clock frequencies of the first and second sampling clock respectively.

It should be noted that, in an example the sampling unit in some embodiments of the present disclosure may be implemented as a counter, that is, the counter counts the clock edges, such that the sampling of the clock frequencies of the first and second sampling clocks is achieved. In another example, the sampling unit in some embodiments of the present disclosure may also be implemented as a frequency meter, that is, the sampling frequencies of the first and second sampling clocks are directly measured by the frequency meter, such that the sampling of the clock frequencies of the first and second sampling clocks is achieved. The following embodiment describes that the sampling of the clock frequencies of the first and second sampling clocks is realized by counting the clock edges by a counter.

Figure 4:
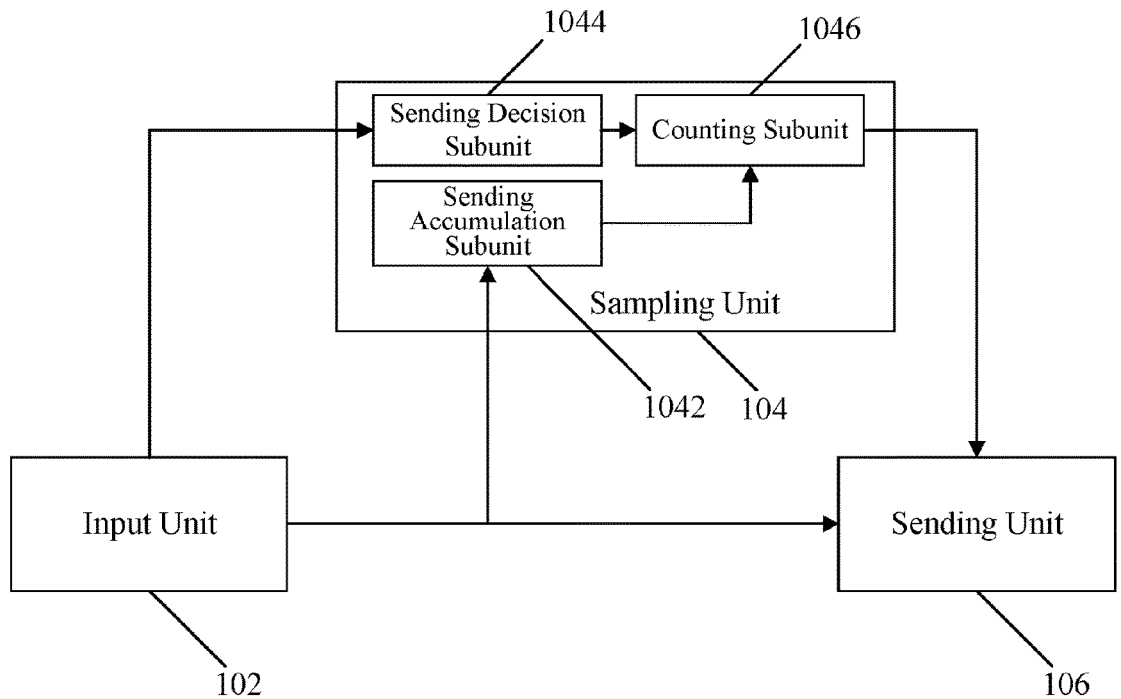
FIG. 4 depicts a schematic diagram (3) showing an apparatus for sending a clock according to yet another embodiment of the present disclosure.

FIG. 4 depicts a schematic diagram (3) showing an apparatus for sending a clock according to yet another embodiment of the present disclosure. As shown in FIG. 4, in the embodiment, the sampling unit 104 includes a sending accumulation subunit 1042, a sending decision subunit 1044, and a counting sub-unit 1046.

The sending accumulation subunit 1042 is configured to accumulate clock edges of the first sampling clock.

The sending decision subunit 1044 is configured to decide the clock edges of the second sampling clock.

The counting subunit 1046 is configured to count the clock edges of the second sampling clock according to the decision from the sending decision subunit, and determine the counted value of the clock edges of the second sampling clock once the clock edges of the first sampling clock accumulated to a preset value, to obtain the first frequency control word.

In the sampling unit shown in FIG. 4, the first sampling clock is sent to the sending accumulation subunit to accumulate the clock edges, usually, the rising edges, of the first sampling clock, while the second sampling clock is sent to the sending decision subunit to decide the clock edges, usually the rising edges, of the second sampling clock, and the counting subunit can count the clock edges of the second sampling clock according to the decision of the clock edges. When the accumulated value of the sending subunit for the clock edges of the first sampling clock reaches the preset threshold, the counted value of the counting subunit can be latched and cleared, and the current counted value of the clock edges of the second sampling clock in the latched state can form the first frequency control word in an embodiment of the present disclosure, and the cleared counter can count the clock edges of the second sampling clock again.

In the above sampling unit, the sending accumulation subunit may be formed of an accumulator, for example, a $2^N$ accumulator, the sending decision subunit may be formed of a decider, and the counting subunit may be formed of a counter. In an example, the sending accumulation subunit as a $2^N$ accumulator, the first sampling clock is set at 1000000080 Hz, the second sampling clock is set at 10000004 Hz, and the value of N in $2^N$ accumulator is 32, then the operating process of the above sampling unit is as follows.

The $2^N$ accumulator accumulates the number of rising edges of the 1000000080 Hz clock corresponding to the first sampling clock, and at the same time, the decider decides the rising edges of the 10000004 Hz clock corresponding to the second sampling clock, and the counter counts the rising edges of the second sampling clock according to the decision. When the accumulated number of the $2^N$ accumulator for the rising edges reaches 2^32, the counter latches the number of rising edges of the current second sampling clock. For example, when the accumulated number of the $2^N$ accumulator for the rising edges of the first sampling clock reaches 4294967296 (i.e., 2^32), at this time, the number of rising edges of the second sampling clock latched by the counter is 42949687, then 42949687 is the first frequency control word for the second sampling clock.

Figure 5:
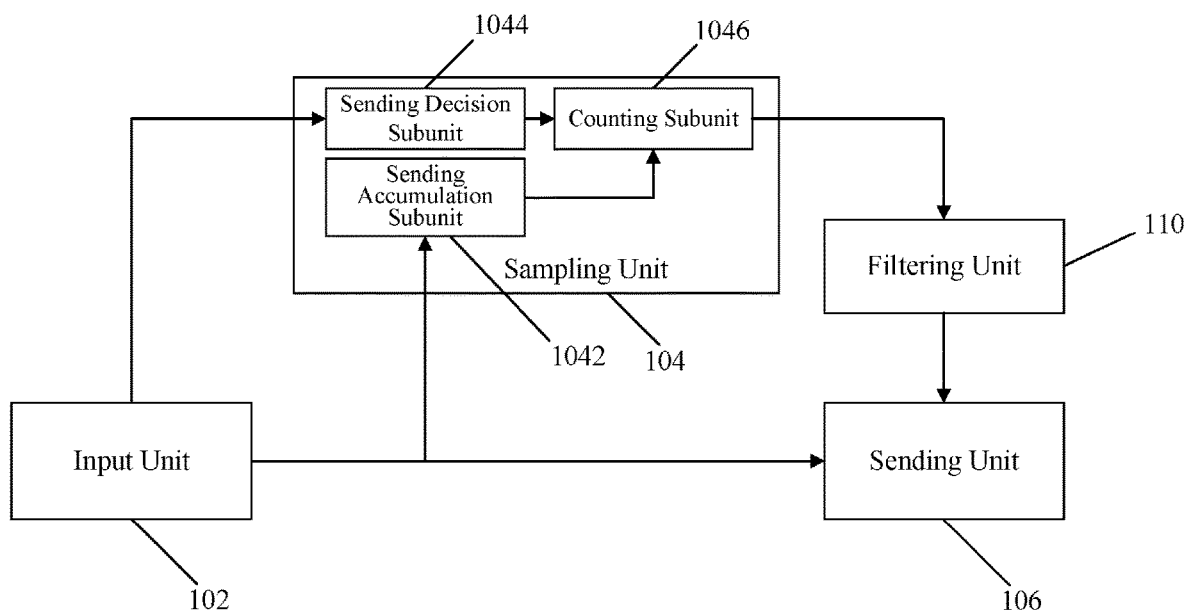
FIG. 5 depicts a schematic diagram (4) showing an apparatus for sending a clock according to yet another embodiment of the present disclosure.

It should be noted that the above counter can only record integers, that is, the first frequency control word obtained is a rounded value with some errors. FIG. 5 depicts a schematic diagram (4) showing an apparatus for sending a clock according to yet another embodiment of the present disclosure. As shown in FIG. 5, the apparatus for sending a clock in the embodiment of the present disclosure may further include a filtering unit 110 for compensating the potential errors in the first frequency control word.

The filtering unit 110 is configured to filter the first frequency control word according to a preset filtering method, and send the filtered first frequency control word to the sending unit, such that the sending unit can have the filtered first frequency control word carried in the clock signal.

It should be noted that various preset filtering methods can be utilized in the above filtering unit. In one example, mean filtering may be utilized as a filtering mode by the filtering unit, and in another example, moving mean filtering may be utilized as a filtering mode. For any filtering method, it is necessary for the sampling unit to provide several sets of data, that is, several first frequency control words. The filtering process of the first frequency control words will be illustrated below by means of average filtering.

The sampling unit is caused to repeatedly perform the following operations to obtain a plurality of first frequency control words, determining the first frequency control words according to the first and second sampling clocks. Specifically, still taking the above sampling unit based on a $2^N$ accumulator and counter as an example, when the number of rising edges of the first sampling clock accumulated by the $2^N$ accumulator reaches $2^N$, at this time the counter latches and clears the counted rising edges of the second sampling clock, and outputs the first frequency control word (denoted as $K_1$). Once the counter is cleared, the $2^N$ accumulator continues to accumulate the number of rising edges of the first sampling clock, while the counter starts counting the rising edges of the second sampling circuit again. When the number of rising edges of the first sampling clock accumulated by the $2^N$ accumulator reaches $2^N$ again, the counter latches and clears the counted rising edges of the second sampling clock, and outputs the first frequency control word (denoted as $K_2$), and so on. That is, the counter outputs a frequency control word (denoted as $K_1, K_2 \ldots K_M$, where M is a positive integer greater than 1) every time when the number of rising edges of the first sampling clock accumulated by the $2^N$ accumulator reaches $2^N$.

Once the counter outputs the above $K_1, K_2 \ldots K_M$, the filtering unit can utilize the average value of $K_1, K_2 \ldots K_M$ as the filtered first frequency control word (denoted as K), and then K should satisfy $(K_1, K_2 \ldots K_M)/M$.

On the one hand, the filtered first frequency control word output by the filtering unit can be non-integer, and on the other hand, the jitter that may occur to the first frequency control word output by the sampling unit at a certain time can be converged and stabilized, thereby the errors in the filtered first frequency control word can be effectively reduced.

Figure 6:
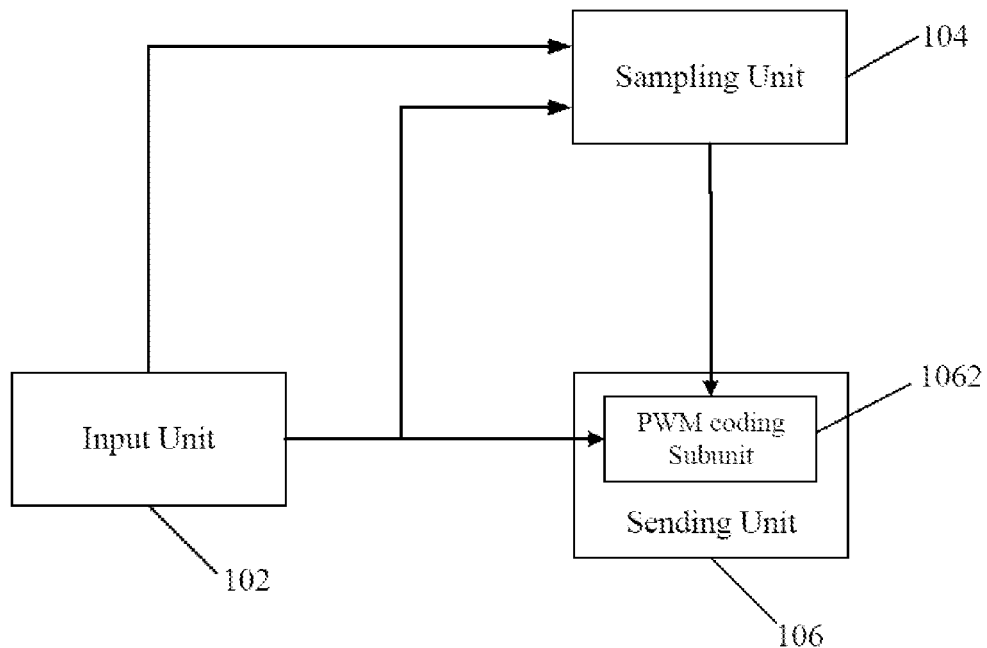
FIG. 6 depicts a schematic diagram (5) showing an apparatus for sending a clock according to yet another embodiment of the present disclosure.

Once the output of the first frequency control word is completed, the sending unit in an embodiment of the present disclosure can have the first frequency control word carried in the clock signal generated based on the first input clock, and send the clock signal to the receiving side through the clock line. The sending unit may include a sending port configured to be connected to a clock line. FIG. 6 depicts a schematic diagram (5) showing an apparatus for sending a clock according to yet another embodiment of the present disclosure. As shown in FIG. 6, the sending unit 106 in the embodiment of the present disclosure may further include, a pulse width modulation (PWM) coding subunit 1062.

The PWM coding subunit 1062 is configured to code a first input clock to generate a clock signal and envelope a first frequency control word in the clock signal, in which the clock frequency of the clock signal is the clock frequency of the first input clock.

The PWM coding subunit in this embodiment may modulate the first frequency control word based on the first input clock into a clock signal based on PWM wave, and send the first frequency control word to the receiving side. It should be noted that the modulation of the above PWM may be performed through the duty cycle modulation method, Manchester coding method, 8B/10B coding method, 64B/66B coding method, or the like. And it is not intended to limit this in the present disclosure.

A Direct Digital Synthesis (DDS) signal generator with coding capability, a Digitally Controlled Oscillator (DCO), a Digital Phase Locked Loop (DPLL), a single chip microcomputer, a field programmable gate array processor, application specific Integrated Circuit (IC), System-on-a-Chip (SOC), or the like, may be deployed in the PWM coding subunit. The above-mentioned PWM coding subunit is composed of one or more of the above-mentioned devices, that is, any device that can encode and combine the first input clock into a PWM wave carrying the first frequency control word can be the PWM coding subunit in the embodiments of the present disclosure.

It should be noted that, in the above example, in case that the apparatus for sending a clock in an embodiment of the present disclosure includes a frequency multiplication unit and a filtering unit, the above clock signal shall carry multiple for the frequency multiplication unit, such as the first multiple, the second multiple, the third multiple and the fourth multiple, and the first frequency control word carried in the clock signal is the filtered frequency control word.

By means of the apparatus for sending a clock in an embodiment of the present disclosure, during the transmission of the clock at the sending end, for the first and second input clocks to be sent, and input by the input unit, the first sampling clock determined by the first input clock according to the preset rule and the second sampling clock determined by the second input clock according to the preset rule are acquired by the sampling unit, and the first frequency control word which is indicative of the relationship between the first sampling clock and the second sampling clock, is determined according to the first sampling clock and the second sampling clock. Further, the sending unit generates a clock signal carrying the first frequency control word according to the first input clock, and sends the clock signal to the receiving side; Therefore, the apparatus for sending a clock in the embodiment of the present disclosure can send the first input clock and the second input clock at the same time, and there is no restriction on whether the first input clock and the second input clock are homologous. Therefore, the embodiment of the present disclosure can address the issue of the complicated and ineffective layout of the clock lines for clock distribution in communication equipment in the art, which significantly simplifies the layout of clock lines for the clock distribution, thereby reducing the cost in backplane manufacturing.

It should be noted that the apparatus for sending a clock in the embodiment of the present disclosure can realize the transmission of diverse-sourced clocks via the same clock line. Therefore, during the clock distribution, only one clock line is needed in communication equipment for transmission of diverse-sourced clocks, eliminating the layout of separate clock line for each of the diverse-sourced clocks, so that the amount of clock lines for clock distribution is significantly reduced, and the space utilization of the backplane for wiring is greatly improved. Meanwhile, by means of the apparatus for sending a clock device in an embodiment of the present disclosure, it is not necessary to expand the wiring, PCB layer, connectors, or the like, for excessive lines during the manufacture of the backplanes, thus reducing the cost for manufacturing the backplanes.

Figure 7:
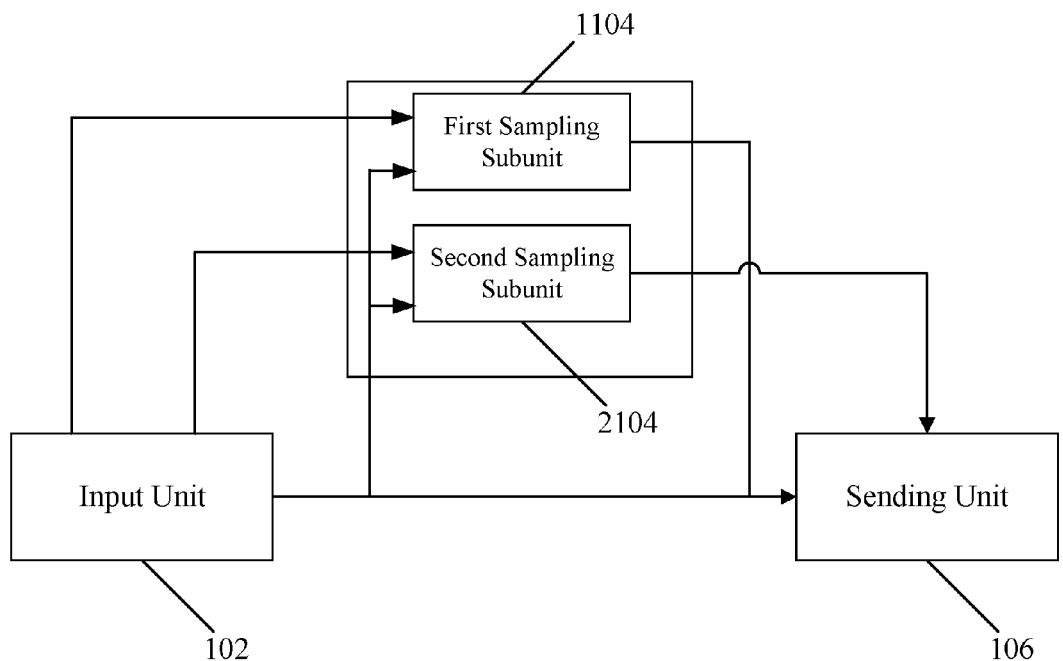
FIG. 7 depicts a schematic diagram (6) showing an apparatus for sending a clock according to yet another embodiment of the present disclosure.

It should be noted that the several second input clocks may be provided in some embodiments of the present disclosure, that is, the apparatus for sending a clock in some embodiments of the present disclosure can simultaneously send any number of diverse-sourced clocks. FIG. 7 depicts a schematic diagram (6) showing an apparatus for sending a clock according to an embodiment of the present disclosure. In the embodiment as shown in FIG. 7, the apparatus for sending a clock may simultaneously send three diverse-sourced clocks to the receiving side, which embodiment will be illustrated below.

In one implementation, the apparatus for sending a clock in this embodiment of the present disclosure further includes, an input unit 102 and a sampling unit 104.

The input unit 102 is configured to input a first input clock, a second input clock and a third input clock.

The sampling unit 104 includes a first sampling subunit 1104 and a second sampling subunit 2104.

The first sampling subunit 1104 is configured to determine a first frequency control word according to a first sampling clock and a second sampling clock.

The second sampling subunit 2104 is configured to determine the second frequency control word according to the first sampling clock and the third sampling clock; and the second frequency control word is indicative of the relationship between the first sampling clock, and the third sampling clock that is determined based on a third input clock according to a preset rule.

The sending unit 106 is configured to generate a clock signal based on the first input clock and send the clock signal to the receiving side, in which the clock signal carries at least a first frequency control word and a second frequency control word.

It should be noted that the operating processes of the first and second sampling units can be referred to the above description regarding the sampling unit, and which will not be repeated here.

Therefore, during the sending of several diverse-sourced clocks, in the apparatus for sending a clock in this embodiment of the present disclosure, a corresponding sampling module can be set up for any one of the diverse-sourced clocks, and the first input clock is utilized as a reference to further determine the corresponding frequency control word of one of the diverse-sourced clocks.

It should be noted that the first input clock in some embodiments of the present disclosure may be any one of several diverse-sourced clocks to be sent by the sending side to the receiving side, or may be the reference clock of the sending side. In one example, the first input clock may be the local clock of the sending side, and in another example, the first input clock may be an external reference clock introduced by the sending side.

Figure 8:
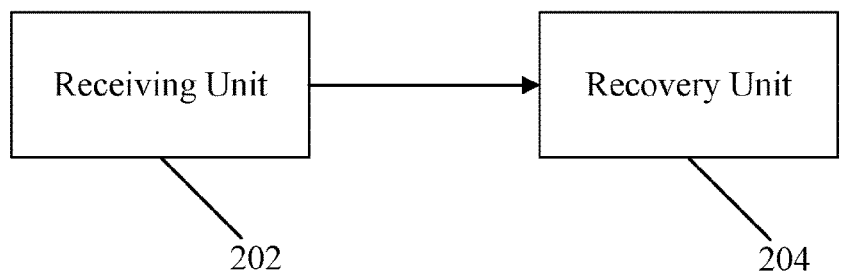
FIG. 8 depicts a schematic diagram (1) showing an apparatus for receiving a clock according to an embodiment of the present disclosure.

An embodiment of the present disclosure further provides an apparatus for receiving a clock, and FIG. 8 depicts a schematic diagram (1) showing the apparatus for receiving a clock according to the embodiment of the present disclosure. As shown in FIG. 8, the apparatus in the embodiment of the present disclosure includes, a receiving unit 202 and a recovery unit 204.

The receiving unit 202 is configured to receive the clock signal sent by the sending side in which, the clock signal is generated according to the first input clock from the sending side, and the clock signal carries at least a first frequency control word which is indicative of the relationship between the first sampling clock and the second sampling clock, the first sampling clock is determined by the first input clock according to a preset rule, and the second sampling clock is determined by the second input clock of the sending side according to a preset rule. The receiving unit 202 is further configured to determine the first input clock and the first frequency control word according to the clock signal.

The recovery unit 204 is configured to determine the second input clock according to the first input clock and the first frequency control word.

It should be noted that the clock signal received by the apparatus for receiving a clock in the embodiment of the present disclosure is the clock signal sent by the apparatus for sending a clock in the embodiment of the present disclosure as described above, therefore, the generation or pre-processing process of the clock signal by the apparatus for sending a clock corresponds to the description for the apparatus for sending a clock as described above, which is not repeated here.

Figure 9:
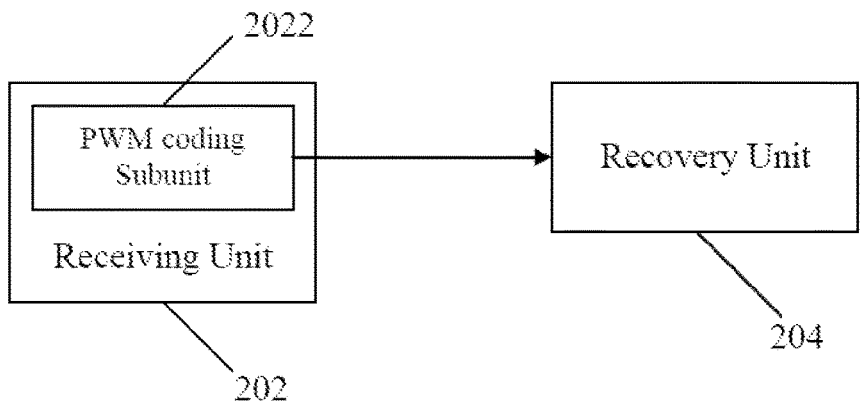
FIG. 9 depicts a schematic diagram (2) showing an apparatus for receiving a clock according to another embodiment of the present disclosure.

The receiving unit in the embodiment of the present disclosure is configured to receive the clock signal sent by the sending side through the clock line, and the receiving unit may include a receiving port configured to be connected to the clock line. FIG. 9 depicts a schematic diagram (2) of the receiving unit according to an embodiment of the present disclosure. As shown in FIG. 9, the receiving unit may further include a PWM decoding subunit 2022 configured to decode the clock signal to recover the first input clock and extract the first frequency control word carried in the clock signal.

It should be noted that, when the clock signal in the embodiment of the present disclosure is a PWM wave coded and combined by the PWM coding subunit at the sending side, the receiving unit may decode and recover the received PWM wave by the above PWM decoding unit, so as to obtain the corresponding first input clock and first frequency control word from the PWM wave.

Similar to the PWM coding unit, a DDS signal generator, a DCO, a DPLL, a single chip microcomputer, a field programmable gate array processor, special IC, SOC, or any decoding device, may be deployed in the PWM decoding subunit as described above. The PWM decoding subunit is composed of one or more of the above devices, that is, any device that can decode the clock signal to obtain the first input clock and the first frequency control word can be the PWM decoding subunit in the embodiment of the present disclosure.

In this embodiment, the first input signal and the first frequency control word received by the receiving unit can be sent to the recovery unit for recovery of the second input signal, and the recovery unit 204 can be further configured to, generate a first sampling clock according to a first input clock, and determine a plurality of first phase addresses according to the first sampling clock and a first frequency control word, in which the first phase addresses are indicative of the phases of the second sampling clock; and determine a second sampling clock according to the plurality of first phase addresses, and determine the second input clock according to the second sampling clock.

It should be noted that, in case the apparatus for sending a clock that sends the clock signal includes the frequency multiplication unit as described above, that is, the first sampling clock or the second sampling clock is generated through multiplication by the first input clock or the second input clock according to the preset frequency multiples, then the receiving unit can obtain, in addition to first input clock and the first frequency control word, the frequency multiples carried by the clock signal, for example, the first multiple, the second multiple, the third multiple and the fourth multiple in the frequency multiplication unit as described above. The apparatus for receiving a clock in this embodiment, once obtaining the first input clock, shall multiply the frequency of the first input clock with the same frequency multiple as that in the apparatus for sending a clock, and then the recovery unit recovers the second input clock. In an example, in the apparatus for sending a clock, the first sampling clock is obtained by multiplication of the first input clock by 40 times by the frequency multiplication unit, and the second input clock is directly served as the second sampling clock without processing. In the above case, once the receiving unit obtaining the first input clock, the first frequency control word and the frequency multiple, shall perform a 40-time frequency multiplication on the first input clock, and send the multiplied first input clock to the recovery unit for recovery. In another example, in the apparatus for sending a clock, the first frequency multiplication subunit of the frequency multiplication unit multiplies the first input clock by 40 times to obtain the first sending clock, and the second frequency multiplication subunit multiplies the first sending clock by 20 times to obtain the first sampling clock, while the third frequency multiplication subunit multiplies the second input clock by 20 times to obtain the second sampling clock. In the above case, the receiving unit directly obtains from the clock signal, the first sending signal, the first frequency control word and the frequency multiples corresponding to the first, second and third frequency multiplication subunit as described above. And the apparatus for receiving a clock in the embodiment of the present disclosure shall perform a 20 times frequency multiplication to the first sending signal, and send the multiplied first sending clock to the recovery unit for recovery. Meanwhile, a 1/40 times of frequency demultiplication shall be performed to the first sending clock to recover the first input clock, and a 1/20 times of frequency demultiplication shall be performed to the signal directly output by the recovery unit to recover the second input clock. The process by the apparatus for sending a clock, of the frequency multiplication to the first input clock is exactly the process by the recovery unit for obtaining the first sampling clock according to the first input clock.

It should be noted that the first phase address as described above is indicative of the corresponding waveform of the second sampling clock. In an example, the second sampling clock is a square wave or a sine wave.

It should be noted that once the second sampling clock is determined, the second input clock may be recovered from the second sampling clock according to the rule for determining the second sampling clock according to the second input clock as described above.

Figure 10:
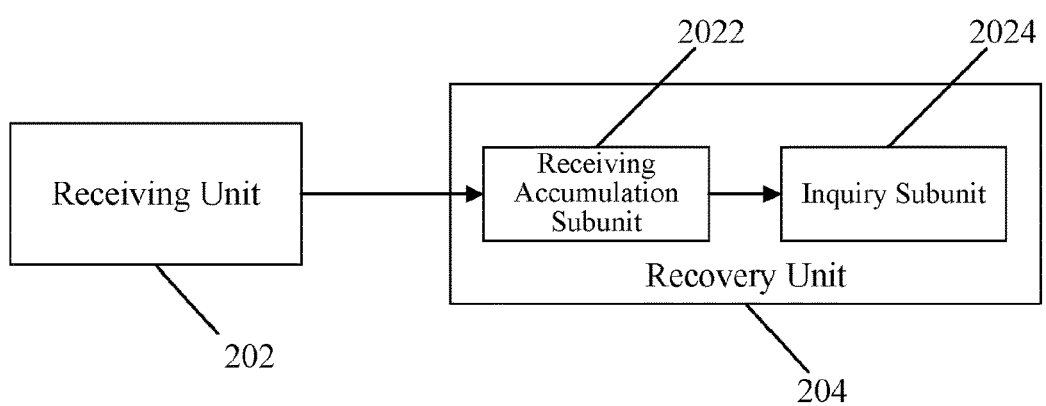
FIG. 10 depicts a schematic diagram (3) showing an apparatus for receiving a clock according to yet another embodiment of the present disclosure.

The determination of the first phase address will be illustrated by way of an example below. FIG. 10 depicts a schematic diagram (3) showing an apparatus for receiving a clock according to an embodiment of the present disclosure. As shown in FIG. 10, the recovery unit 204 includes, a receiving accumulation subunit 2042, and an inquiry subunit 2044.

The receiving accumulation subunit 2042 is configured to accumulate the first frequency control word according to the clock edges of the first sampling clock, and obtain a plurality of first phase addresses according to each accumulation result of the first frequency control word.

The inquiry subunit 2044 is configured to obtain the waveform of the second sampling clock according to the plurality of first phase addresses and a preset mapping relationship, in which the mapping relationship is indicative of the mapping relationship between the first phase addresses and the waveform parameters preset by the second sampling clock. The inquiry subunit is further configured to determine the clock frequency of the second sampling clock according to the waveform of the second sampling clock.

In the recovery unit as shown in FIG. 10, once the first sampling clock is sent to the receiving accumulation subunit, the receiving accumulation subunit may accumulate the first frequency control word according to the clock edges of the first sampling clock to obtain the first phase addresses. During the accumulation, each time when the first sampling clock reaches its clock frequency, the receiving accumulation subunit may accumulate the first frequency control word once according to the clock edge of the first sampling clock in this case, and the accumulation result of each time is a first phase address, so that the receiving accumulation subunit can obtain a plurality of first phase addresses.

In the recovery unit as described above, the receiving accumulation subunit may be composed of an accumulator, for example, a $2^N$ accumulator. The operating process of the recovery unit will be illustrated below by way of an example in which the receiving accumulation subunit is a $2^N$ accumulator, the first sampling clock is set at 1 GHz and the first frequency control word is set as 42949672.

The $2^N$ accumulator accumulates the rising edges of the first sampling clock according to the clock frequency of the first sampling clock, that is, every time the rising edge of 1 GHz is reached, the $2^N$ accumulator accumulates the first frequency control word once, and every time the accumulation is completed, one first phase address can be obtained, which is the accumulation result of the current time of accumulation. When the accumulation result is greater than a preset threshold, such as $2^{32}$, the $2^N$ accumulator clears the accumulation result and restarts the accumulation. The above accumulation process is as follows.

When 1 GHz is reached for the first time, the accumulation result of the $2^N$ accumulator is 42949672*1=42949672, and the corresponding first phase address is 42949672.

When 1 GHz is reached for the second time, the accumulation result of the $2^N$ accumulator is 42949672*2=85899344, and the corresponding first phase address is 85899344.

When 1 GHz is reached for the third time, the accumulation result of $2^N$ accumulator is 42949672*3=128849016, and the corresponding first phase address is 128849016.

And so on . . . .

When 1 GHz is reached for the 100th time, the accumulation result of the $2^N$ accumulator is 42949672*100=4294967200, and the corresponding first phase address is 4294967200.

When 1 GHz is reached for the 101st time, the accumulation result of the $2^N$ accumulator is 42949672*101=4337916872, and this value is greater than $2^{32}$, then accumulator clears and restarts the accumulation. The accumulation result of the $2^N$ accumulator is 42949672*1=42949672, and the corresponding first phase address is 42949672.

When 1 GHz is reached for the 102nd time, the accumulation result of the $2^N$ accumulator is 42949672*2=85899344, and the corresponding first phase address is 85899344.

For the first phase address accumulated every time, the inquiry subunit may query the waveform parameters of the second sampling clock corresponding to the current first phase address. The waveform parameters are indicative of the parameters of periodic waveforms, in which the waveform parameters include at least one of the following, an output level value of a square wave, an output level value of a sine wave, an output level value of a triangular wave, an output level value of a sawtooth wave, an output level value of a pulse (i.e., the output level value corresponding to waveforms with duty ratio not being 50%). In an example, the waveform parameter of the second sampling clock may be an output level value of a sine wave. In another example, the waveform parameter of the second sampling clock may be an output level value of a square wave. The following description will be provided in conjunction with the waveform parameters of the second sampling clock.

In the example where the waveform parameter is the output level value of the square wave, the inquiry subunit 2044 is further configured to decide a plurality of first phase addresses according to the mapping relationship, and obtain the waveform of the second sampling clock according to the decision.

In the above example, since the waveform parameter is the output level value of the square wave, the inquiry subunit can be directly a decider, that is, the first phase address corresponding to the accumulation result of the receiving accumulation subunit is decided according to a preset rule, to determine to output a high level or a low level. The mapping relationship can be determined in advance. For example, a low level will be output in case that the first phase address is less than or equal to $2^{31}$, or a high level will be output in case that the first phase address is greater than $2^{31}$, that is, $2^{32}$. In this way, a plurality of output level values of square wave corresponding to the first phase addresses can be output through the decision of the inquiry subunit, and then the waveform of the second sampling clock can be obtained. The clock frequency of the second sampling clock can be determined based on the square waveform of the second sampling clock.

Figure 11:
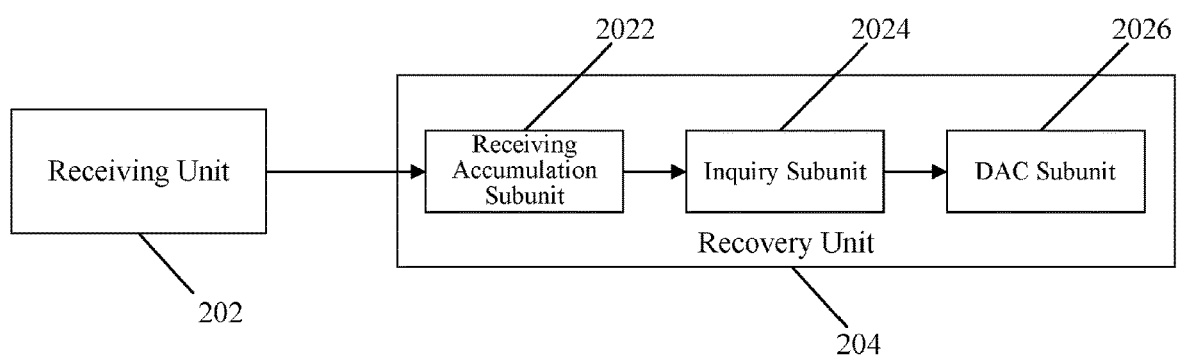
FIG. 11 depicts a schematic diagram (4) showing an apparatus for receiving a clock according to yet another embodiment of the present disclosure.

FIG. 11 depicts a schematic diagram (4) showing an apparatus for receiving a clock according to yet another embodiment of the present disclosure where the waveform parameter is the output level value of the sine wave. As shown in FIG. 11, the inquiry subunit 2044 is further configured to obtain a plurality of output level values of a sine wave corresponding to a plurality of first phase addresses respectively according to the first phase addresses and the preset mapping relationship.

The recovery unit 204 further includes a Digital-to-Analog Converter (DAC) subunit 2046, which is configured to perform digital-to-analog conversion on a plurality of output level values of the sine wave to obtain the waveform of the second sampling clock.

In the above example, since the waveform parameters are output level values of the sine wave, the inquiry subunit shall include a preset local Read-Only Memory (ROM) table, which stores the mapping relationship as described above, that is, the mapping relationship between the first phase addresses and the corresponding output level values of the sine wave. Taking the first phase addresses being 0, 1, 2, and 3 as an example, the local ROM table stores the mapping relationship between the first phase addresses 0, 1, 2, and 3 and the output level values of the sine wave, which may be:

0 ~0V;
1 ~1.65V;
2 ~3.3V; and
3 ~1.65V.

Therefore, when the first phase address corresponding to the accumulation result of the receiving accumulation subunit is 0, the query subunit may determine that the output level value of the sine wave corresponding to the first phase address is 0V through the mapping relationship stored in the local ROM table, and further, the DAC subunit may output a level of 0V through digital-to-analog conversion. In this way, a plurality of output level values of the sine wave corresponding to the first phase addresses can be successively output by means of the inquiry subunit and DAC subunit, and then the waveform of the second sampling clock can be obtained. The clock frequency of the second sampling clock can be determined based on the sinusoidal waveform of the second sampling clock as described above.

It should be noted that when more than two input clocks are present in the apparatus for sending a clock, the apparatus for receiving a clock in the embodiments of the present disclosure can also restore those input clocks one by one. In an embodiment, the clock signal additionally carries a second frequency control word, which is indicative of the relationship between the first sampling clock, and the third sampling clock which is determined by the third input clock of the sending side according to a preset rule. In the apparatus for receiving a clock in this embodiment, the receiving unit may determine the second frequency control word according to the clock signal while determining the first input clock and the first frequency control word, and determine the third input clock according to the first input clock and the second frequency control word with reference to the method for recovering the second input clock as described above.

The following description will be presented through several embodiments in order to further illustrate the apparatus for sending a clock, apparatus for receiving a clock, and clock transmission system in the embodiments of the present disclosure. It should be noted that in the following embodiments, the sending module represents the apparatus for sending a clock in the above embodiments of the present disclosure, and the receiving module represents the clock receiving module in the above embodiments of the present disclosure. The sending module along with the receiving module constitute the clock transmission system in some embodiments of the present disclosure.

Example Embodiment One

Figure 12:
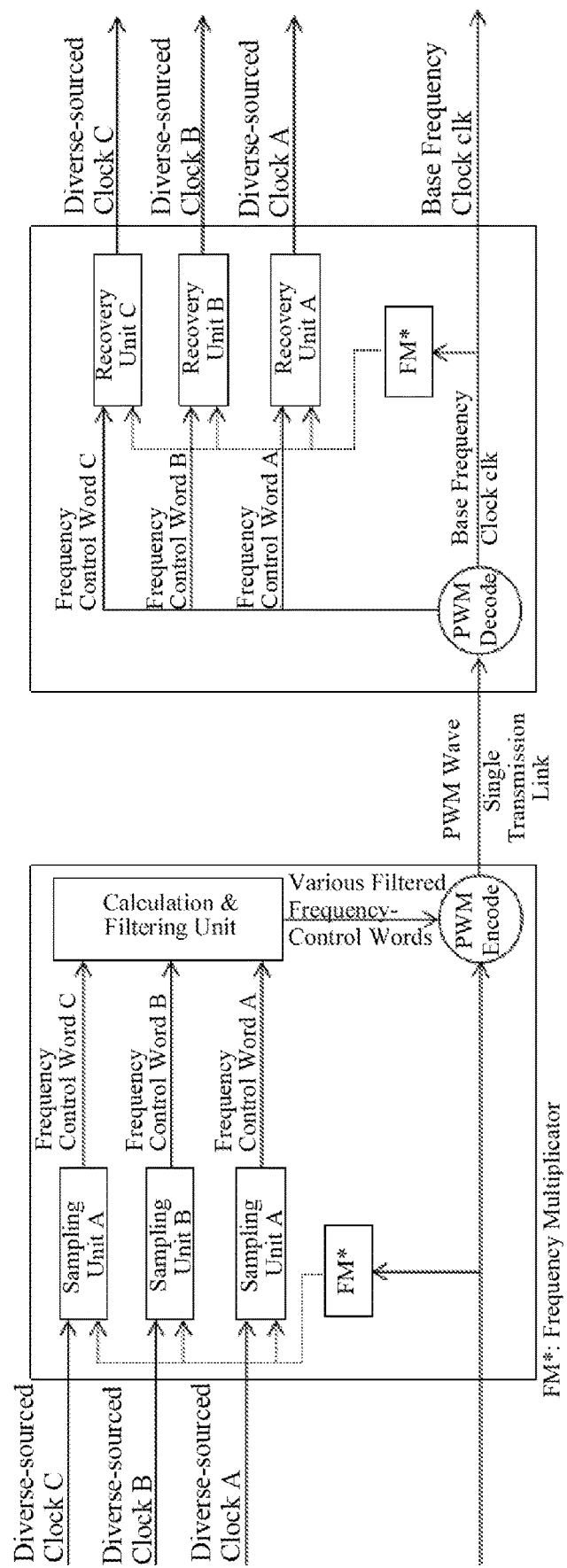
FIG. 12 depicts a schematic diagram showing a topology of clock networking according to an embodiment of the present disclosure.
Figure 13:
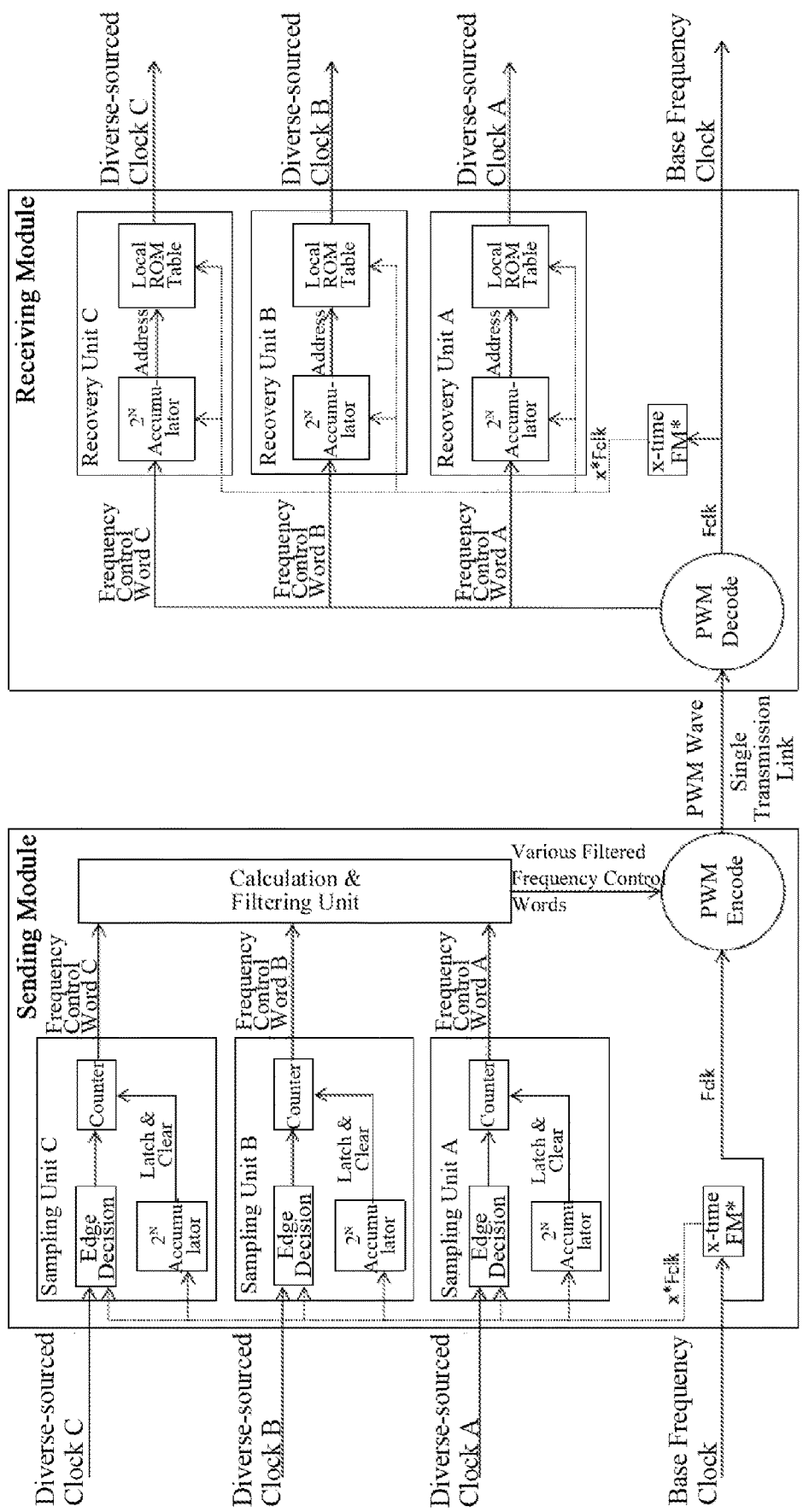
FIG. 13 depicts a schematic diagram (1) showing components of clock networking according to an embodiment of the present disclosure.

FIG. 12 depicts a schematic diagram showing a topology of clock networking according to an embodiment of the present disclosure, in which networking the clock distribution process is performed. FIG. 13 depicts a schematic diagram (1) showing components of clock networking according to an embodiment of the present disclosure. In this embodiment, the components of the sending module and the receiving module in the clock distribution process are shown in FIG. 13. As shown in FIG. 13, in this embodiment, the clocks to be transmitted input by the sending module include four types of diverse-sourced clocks with different frequencies, and the above four types of diverse-sourced clocks are, base frequency clock $F_{clk}$=25000002 Hz, diverse-sourced clock A=3000018 Hz, diverse-sourced clock B=10000004 Hz, and diverse-sourced clock C=19440009 Hz.

The base frequency clock $F_{clk}$=25000002 Hz, once entering the sending module, is split into two channels of signals, one of which enters the frequency multiplication unit for frequency multiplication. The frequency multiplication unit in this embodiment multiplies the base frequency clock by 40 times, so that the base frequency clock becomes $40*F_{clk}$=1000000080 Hz. The multiplied base frequency clock is provided to sampling unit A, sampling unit B and sampling unit C, and provides the basic clock for edge decision and $2^N$ accumulator. The other channel of the base frequency clock $F_{clk}$=25000002 Hz is sent to the PWM coding unit without frequency multiplication, which provides the basic clock for the PWM coding unit.

The diverse-sourced clock A=33000018 Hz enters the sampling unit A, and is subject to edge decision by the 40-times multiplied base frequency clock provided by the frequency multiplier, and the result is sent to the counter for accumulation. The 40-time multiplied base frequency clock provided by the frequency multiplier is $40*F_{clk}$=1000000080 Hz, is sent to the accumulator for accumulation in a single accumulation mode. When the accumulated value equals to $2^N$, the counter of the subsequent stage is latched and cleared. Accordingly, the $2^N$ accumulator is also cleared and the accumulation is restarted. Every moment the accumulated value of the $2^N$ accumulator reaches $2^N$, the value latched by the counter is the frequency control word of the diverse-sourced clock A at the current moment, and the calculation formula is:

$$\left|\frac{C_{freqA}}{C_{x*fclk}}\right| = \left|\frac{K_A}{2^N}\right|.$$

In the above formula, $C_{freqA}$ represents the clock frequency of the diverse-sourced clock A, and $C_{x*fclk}$ represents the clock frequency of the multiplied base frequency clock.

For example, in case that N=32, when the accumulated value of the accumulator reaches 4294967296 times of 40-time multiplied base frequency clock, the counter will latch the frequency control word $|K_A|\approx 141733987$ and transfer the frequency control word to the calculation and filtering unit.

Similarly, the diverse-sourced clock B=10000004 Hz enters the sampling unit B, and is subject to edge decision by the 40-times multiplied base frequency clock provided by the frequency multiplier, and the result is sent to the counter for accumulation. The 40-time multiplied base frequency clock provided by the frequency multiplier is $40*F_{clk}$=1000000080 Hz, is sent to the accumulator for accumulation in a single accumulation mode. When the accumulated value equals to $2^N$, the counter of the subsequent stage is latched and cleared. Accordingly, the $2^N$ accumulator is also cleared and the accumulation is restarted. Every moment the accumulated value of the $2^N$ accumulator reaches $2^N$, the value latched by the counter is the frequency control word of the diverse-sourced clock B $K_B$ at the current moment, and the calculation formula is:

$$\left|\frac{C_{freqB}}{C_{x*fclk}}\right| = \left|\frac{K_B}{2^N}\right|.$$

In the above formula, $C_{freqB}$ represents the clock frequency of the diverse-sourced clock B, and $C_{x*fclk}$ represents the clock frequency of the multiplied base frequency clock.

For example, in case that N=32, when the accumulated value of the accumulator reaches 4294967296 times of 40-time multiplied base frequency clock, the counter will latch the frequency control word $|K_B|\approx 42949687$ and transfer the frequency control word to the calculation and filtering unit.

Similarly, the diverse-sourced clock C=19440009 enters the sampling unit C, and is subject to edge decision by the 40-times multiplied base frequency clock provided by the frequency multiplier, and the result is sent to the counter for accumulation. The 40-times multiplied base frequency clock provided by the frequency multiplier is $40*F_{clk}=1000000080$ Hz, is sent to the accumulator for accumulation in a single accumulation mode. When the accumulated value equals to $2^N$, the counter of the subsequent stage is latched and cleared. Accordingly, the $2^N$ accumulator is also cleared and the accumulation is restarted. Every moment the accumulated value of the $2^N$ accumulator reaches $2^N$, the value latched by the counter is the frequency control word of the diverse-sourced clock C, $K_C$ at the current moment, and the calculation formula is:

$$\left|\frac{C_{freqC}}{C_{x*fclk}}\right| = \left|\frac{K_c}{2^N}\right|.$$

In the above formula, $C_{freqC}$ represents the clock frequency of the diverse-sourced clock C, and $C_{x*fclk}$ represents the clock frequency of the multiplied base frequency clock.

For example, in case that N=32, when the accumulated value of the accumulator reaches 4294967296 times of 40-time multiplied base frequency clock, the counter will latch the frequency control word $|K_C|\approx 83494196$ and transfer the frequency control word to the calculation and filtering unit.

It should be noted that in this embodiment, N takes the value of 32 for the $2^N$ accumulator by way of an example for illustration of the frequency combination, while N may also take any number such as 8, 16, 32, 48, 64, etc. Within a certain threshold, the larger the value of N is, the longer it takes to determine the frequency control word, and the more accurate the result is. Those having ordinary skills in the art may alter the value of N according to the error and accuracy of the system, and it is not intended to limit the value of N in the embodiments of the present disclosure.

As the real-time frequency control words $K_A$, $K_B$, $K_C$ obtained by sampling unit A, sampling unit B and sampling unit C are rounded frequency control words with decimal parts removed, if those frequency control words are directly transmitted to recovery unit A, recovery unit B and recovery unit C of the receiving module, the recovered clocks shall be 33000018.0608 Hz, 10000004.0689 Hz and 19440008.9512 Hz, respectively, with the deviations of +1.8 ppb, +6.9 ppb, and −2.5 ppb from the original diverse-sourced clock A, diverse-sourced clock B, and diverse-sourced clock C respectively.

In order to further reduce the error and jitter, the real-time frequency control words $K_A$, $K_B$, $K_C$ obtained by sampling unit A, sampling unit B and sampling unit C are sent to the calculation and filtering unit. The calculation and filtering unit is configured to filter the real-time frequency control words $K_A$, $K_B$, $K_C$.

In this embodiment, mean filtering is performed with the formula:

$$K = \frac{K_1 + K_2 \ldots\ldots K_M}{M};$$

the above formula indicates that the M frequency control words will be added together in the sampling unit, and the filtering will be achieved by the average value of the M frequency control words. The accuracy of filtering depends on the value of M.

Through the average calculation as described above, the calculated and filtered three types of non-homologous frequency control words with one decimal are $K_A'=141733986.7$, $K_B'=42949686.7$ and $K_C'=83494196.2$ respectively.

It should be noted that the mean filtering in this embodiment is illustrated by way of an example merely, and those having ordinary skills in the art may perform the filtering with various methods, and it is not intended to limit the method for filtering in the embodiments of the present disclosure.

Figure 14:
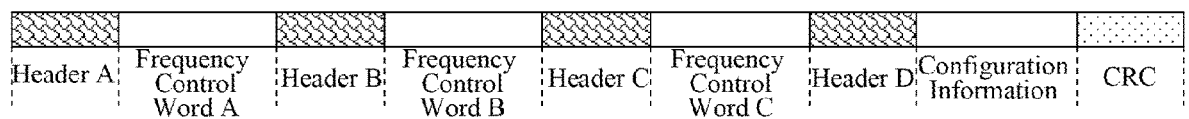
FIG. 14 depicts a schematic diagram showing a frame according to an embodiment of the present disclosure.

The filtered frequency control words $K_A$, $K_B$, $K_C$ are sent to the PWM coding unit that is configured to respectively envelop the three frequency control words $K_A$, $K_B$, $K_C$ into the coded and combined PWM carrier by a frame, based on the base frequency clock $F_{clk}$. FIG. 14 depicts a schematic diagram showing a frame according to an embodiment of the present disclosure. The frame as shown in FIG. 14 is formed in such a manner that, 0001 represents the header of frequency control word A, which is followed by frequency control word A; 0010 represents the header of frequency control word B, which is followed by frequency control word B; 0011 represents the header of frequency control word C, which is followed by frequency control word C; and 1111 represents the header D of the configuration information. Following the headers is the basic information accompanying the frame, such as multiples of frequency multiplication unit, the number of sampling times of the sampling unit, or the like, and which is followed by the CRC bits.

It should be noted that, a header of the frame as described above may be placed before a frequency control word or after a frequency control word. Similarly, the headers 0001-1111 are shown by way of an example for illustration of how the frame is formed, which do not necessarily implicitly indicate any specific content or whether the headers are encrypted. Those having ordinary skills in the art may modify and encrypt the headers as desired, and it is not intended to limit the position, the form and the content of the headers in the present disclosure.

Figure 15:
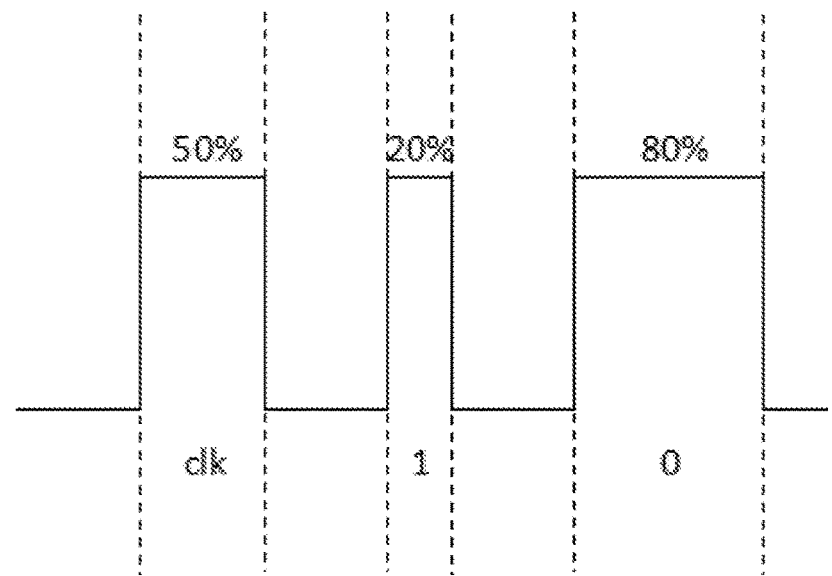
FIG. 15 depicts a schematic diagram showing a PWM coding based on duty cycle modulation according to an embodiment of the present disclosure.

The PWM coding unit may perform coding by duty cycle modulation. FIG. 15 depicts a schematic diagram showing a PWM coding based on duty cycle modulation according to an embodiment of the present disclosure. As shown in FIG. 15, an 80% duty cycle may represent "0", and a 20% duty cycle may represent "1". Alternatively, a 30% duty cycle may represent "0", and a 70% duty cycle may represent "1". And it is not intended to limit this in the present disclosure.

Figure 16:
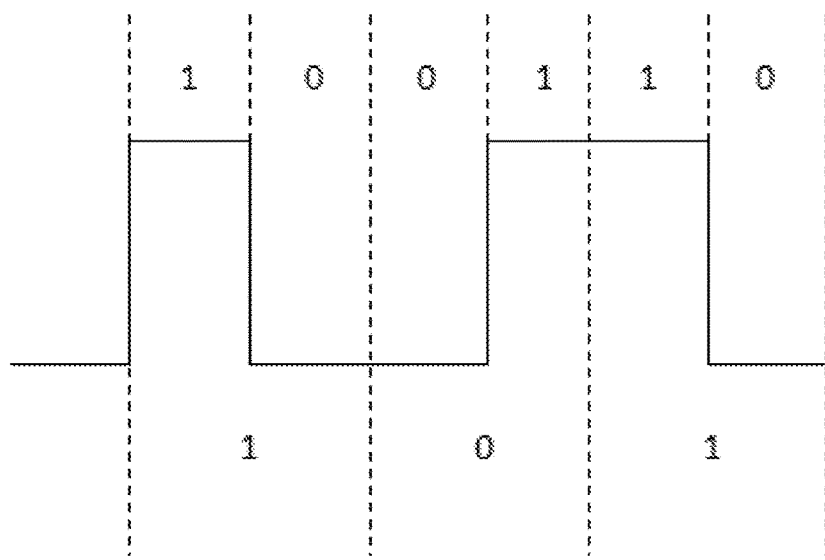
FIG. 16 depicts a schematic diagram showing a PWM coding based on Manchester coding according to an embodiment of the present disclosure.

It should be noted that duty cycle modulation is shown by way of an example in this embodiment for illustration of how the coding and frequency combination is performed, and those having ordinary skills in the art may utilize various methods for coding. FIG. 16 depicts a schematic diagram showing a PWM coding based on Manchester coding according to an embodiment of the present disclosure, that is, Manchester coding may be utilized for PWM coding, as shown in FIG. 16. In addition, PWM waves may be coded by the 8B/10B coding, and it is not intended to limit how the coding is performed in the present disclosure.

Once the coding is completed by the PWM coding unit completes, the frequency control word A, frequency control word B and frequency control word C are coded and combined into the PWM carrier. The coded and combined PWM carrier transmits the signal to the receiving module through a single transmission link. It is to be noted that, the single transmission link may be a PCB trace, a connector, an optical fiber, a differential line, a link with a combination of various physical media, etc., and it is not intended to limit this in the present disclosure.

The PWM carrier transmitted via the single transmission link, once received by the receiving module, is sent to the PWM decoding unit for decoding. The frame headers are identified and decoded such that the frequency control words $K_A$, $K_B$, $K_C$ and the multiple of the frequency multiplication unit are obtained respectively. The $K_A$, $K_B$, $K_C$ are sent to the recovery unit A, recovery unit B and recovery unit C respectively. The multiples for frequency multiplication are sent to the frequency multiplication unit of the receiving module. The PWM decoding unit physically recovers the base frequency clock $F_{clk}$=25000002 Hz from the PWM carrier, and outputs the same to the receiving module as the first receiving clock. In addition, in receiving module, the base frequency clock is introduced to the frequency multiplication unit.

The frequency multiplication unit of the receiving module sets the same multiple as that of the sending module, and multiplies the frequency of the input base frequency clock $F_{clk}$ by 40 times to be $40*F_{clk}$=1000000080 Hz. The 40-time multiplied base frequency clock is sent to recovery unit A, recovery unit B and recovery unit C as the reference clock of each recovery unit.

The filtered diverse-sourced clock frequency control word $K_A'$ is introduced into the recovery unit A, and the 40-time multiplied base frequency clock provided by the frequency multiplier serves as a reference clock, $K_A'$ serves as an accumulation number for accumulation, the maximum value of the accumulator is $2^N$, and according to the following formula, $$F_{reqA} = \frac{F_{clk*x} * K_A'}{2^N};$$

a calculation is performed based on N=32 in this embodiment, and addresses for a local ROM table are generated by successive accumulations. The local ROM table stores addresses corresponding to square waves with values of "1" and "0". When the duty cycle of the output clock is to be 50%, the data corresponding to the first half address of the ROM is "1" and the data corresponding to the second half address is "0".

The actual diverse-sourced clock frequency obtained by correspondence of the outputs from the accumulator with the addresses in the table is $F_{reqA}$=33000017.990991225466132164001465 hz, with the deviation of 0.272 ppb from the 33000018 Hz corresponding to the original diverse-sourced clock A.

Similarly, the filtered diverse-sourced clock frequency control word $K_B'$ is introduced into the recovery unit B, and the 40-time multiplied base frequency clock provided by the frequency multiplier serves as a reference clock, $K_B'$ serves as an accumulation number for accumulation, the maximum value of the accumulator is $2^N$, and according to the following formula, $$F_{reqB} = \frac{F_{clk*x} * K_B'}{2^N};$$

a calculation is performed based on N=32 in this embodiment, and addresses for a local ROM table are generated by successive accumulations. The local ROM table stores addresses corresponding to square waves with values of "1" and "0". When the duty cycle of the output clock is to be 50%, the data corresponding to the first half address of the ROM is "1" and the data corresponding to the second half address is "0".

The actual diverse-sourced clock frequency obtained by correspondence of the outputs from the accumulator with the addresses in the table is $F_{reqB}$=10000003.999093299731612205505371 hz with the deviation of 0.09 ppb from the 10000004 Hz corresponding to the original diverse-sourced clock B.

Similarly, the filtered diverse-sourced clock frequency control word $K_C'$ is introduced into the recovery unit B, and the 40-time multiplied basic frequency clock provided by the frequency multiplier serves as a reference clock, $K_C'$ serves as an accumulation number for accumulation, the maximum value of the accumulator is $2^N$, and according to the following formula, $$F_{reqC} = \frac{F_{clk*x} * K_C'}{2^N};$$

a calculation is performed based on N=32 in this embodiment, and addresses for a local ROM table are generated by successive accumulations. The local ROM table stores addresses corresponding to square waves with values of "1" and "0". When the duty cycle of the output clock is to be 50%, the data corresponding to the first half address of the ROM is "1" and the data corresponding to the second half address is "0".

The actual diverse-sourced clock frequency obtained by correspondence of the outputs from the accumulator with the addresses in the table is $F_{reqC}$=19440008.997809071093797683715823 hz, with the deviation of 0.11 ppb from the 19440009 Hz corresponding to the original diverse-sourced clock C.

It should be noted that the duty cycle of 50% is shown by way of an example for illustration of the determination of the local ROM table addresses, and those having ordinary skill in the art may modify the proportion and sequence of "1" and "0" corresponding to the addresses according to the practical duty cycle requirements, and it is not intended to limit this in the present disclosure. Similarly, the deviations as described above are the deviations between the recovered diverse-sourced clocks in this embodiment and the original diverse-sourced clocks of the sending module, and which are shown by way of an example merely. In practical applications, the deviations as described above may depend on several factors such as the value of N for the accumulator, the filtering capability of the filter, and the depth of the local ROM table, etc. For example, the deviations may be reduced with the increase in the value of N, or may be reduced with the improvement of the filtering capability of the filter. Those having ordinary skills in the art may control or adjust the deviations as desired.

Example Embodiment Two

Figure 17:
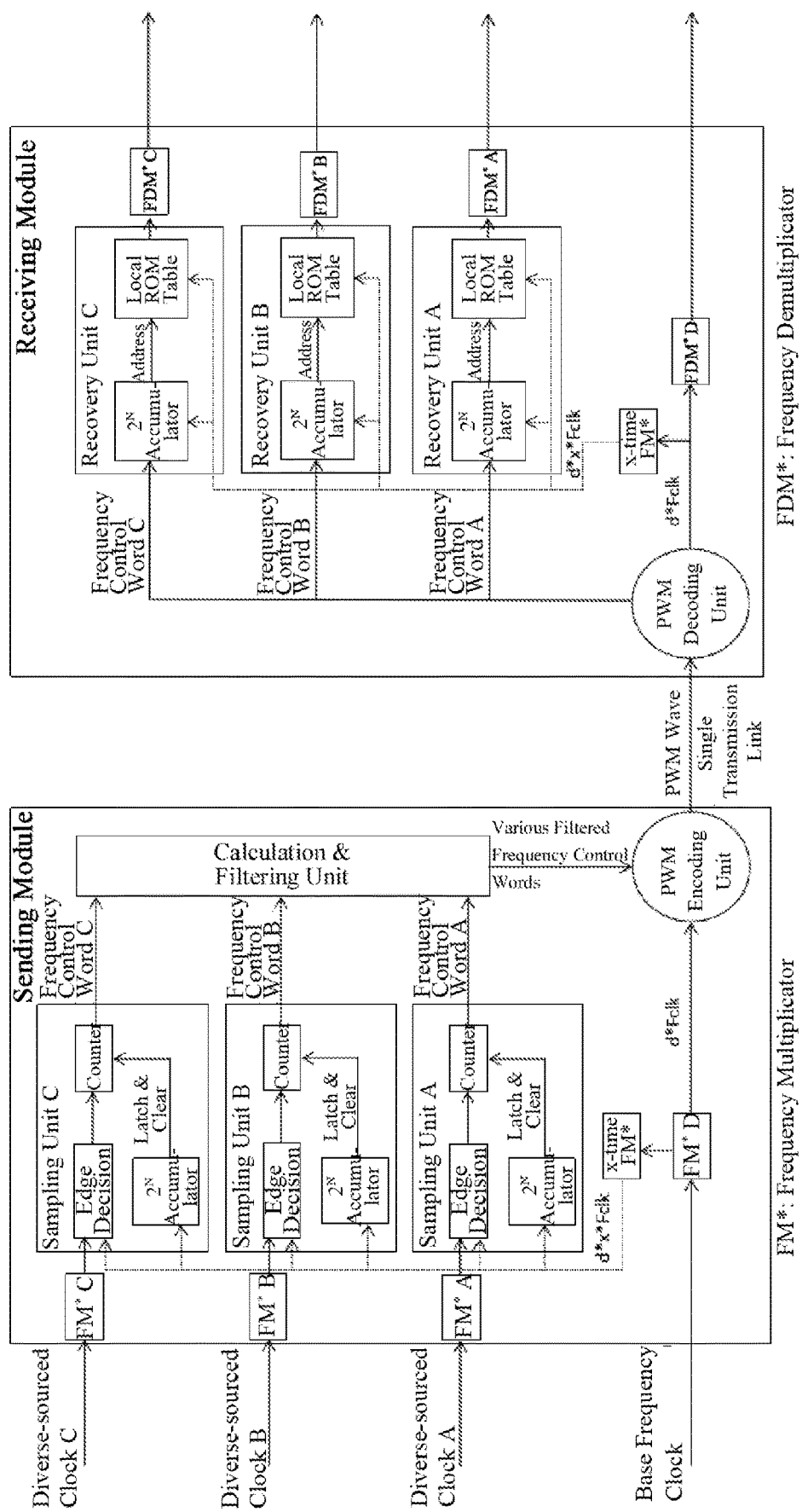
FIG. 17 depicts a schematic diagram (2) showing a topology of clock networking according to an embodiment of the present disclosure.

FIG. 17 depicts a schematic diagram (2) showing a topology of clock networking according to an embodiment of the present disclosure. As shown in FIG. 17, in this embodiment, the clocks to be transmitted input by the sending module include four types of diverse-sourced clocks with different frequencies, and the above four types of diverse-sourced clocks are, base frequency clock $F_{clk}$=10000.0008 Hz, diverse-sourced clock A=8001 Hz, diverse-sourced clock B=10000004 Hz, and diverse-sourced clock C=6480003 Hz.

The base frequency clock $F_{clk}$=10000.0008 Hz, once enters the sending module, is firstly introduced into the first stage frequency multiplication unit D for frequency multiplication. A multiplied base frequency clock having the frequency of $d*F_{clk}$=25000002 Hz is obtained with a 2500-time frequency multiplication. The first stage multiplied base frequency clock is then split into two channels of signals, one signal of $d*F_{clk}$=25000002 Hz is sent to the second stage frequency multiplication unit for frequency multiplication. In this embodiment, the base frequency clock is subject to a frequency multiplication of 40 times, and the frequency of which becomes $40*d*F_{clk}$=1000000080 Hz, which is provided to sampling unit A, sampling unit B and sampling unit C, and provides the basic clock for edge decision and the $2^N$ accumulator. The other channel of the first multiplied base frequency clock having the frequency of $d*F_{clk}$=25000002 Hz is sent to the PWM coding unit without frequency multiplication, which provides the basic clock for the PWM coding unit.

The diverse-sourced clock A=8001 Hz, once entering the sending module, is firstly introduced into the frequency multiplication unit A for a 2000-time frequency multiplication, the clock frequency of which is increased to 16002000 Hz, and which is then sent to the sampling unit A. In the sampling unit A, edge sampling and decision is performed based on the 40-time multiplied base frequency clock provided by the frequency multiplier, and the results are sent to the counter for the addition operation. The 40-times multiplied base frequency clock provided by the frequency multiplier is $40*d*F_{clk}$=1000000080 Hz, is sent to the accumulator for accumulation in a single accumulation mode. When the accumulated value equals to $2^N$, the counter of the subsequent stage is latched and cleared. Accordingly, the $2^N$ accumulator is also cleared and the accumulation is restarted. Every moment the accumulated value of the $2^N$ accumulator reaches $2^N$, the value latched by the counter is the frequency control word of the diverse-sourced clock A at the current moment, and the calculation formula is:

$$\left|\frac{C_{freqA}}{C_{x*fclk}}\right| = \left|\frac{K_A}{2^N}\right|;$$

In the above formula, $C_{freqA}$ represents the clock frequency of the diverse-sourced clock A, and $C_{x*fclk}$ represents the clock frequency of the multiplied base frequency clock.

For example, in case that N=32, when the accumulated value of the accumulator reaches 4294967296 times of 40-time multiplied base frequency clock, the counter will latch the frequency control word $|K_A|\approx 68728061$ and transfer the frequency control word to the calculation and filtering unit.

Similarly, the diverse-sourced clock B=10000004 Hz is introduced into the frequency multiplication unit B, and is subject to no frequency multiplication, that is, the clock frequency of which is kept at 10000004 Hz, and is then sent to the sampling unit B. In the sampling unit B, edge sampling and decision are performed based on the 40-time multiplied base frequency clock provided by the frequency multiplier, and the results are sent to the counter for the addition operation. The 40-time multiplied base frequency clock provided by the frequency multiplier is $40*d*F_{clk}$=1000000080 Hz, is sent to the accumulator for accumulation in a single accumulation mode. When the accumulated value equals to $2^N$, the counter of the subsequent stage is latched and cleared. Accordingly, the $2^N$ accumulator is also cleared and the accumulation is restarted. Every moment the accumulated value of the $2^N$ accumulator reaches $2^N$, the value latched by the counter is the frequency control word of the diverse-sourced clock B $K_B$ at the current moment, and the calculation formula is:

$$\left|\frac{C_{freqB}}{C_{x*fclk}}\right| = \left|\frac{K_B}{2^N}\right|;$$

In the above formula, $C_{freqB}$ represents the clock frequency of the diverse-sourced clock B, and $C_{x*fclk}$ represents the clock frequency of the multiplied base frequency clock.

For example, in case that N=32, when the accumulated value of the accumulator reaches 4294967296 times of 40-time multiplied base frequency clock, the counter will latch the frequency control word $|K_B|\approx 42949687$ and transfer the frequency control word to the calculation and filtering unit.

Similarly, the diverse-sourced clock C=6480003 Hz is introduced into the frequency multiplication unit C, and is subject to a 3-time frequency multiplication, that is, the clock frequency of which becomes C=19440009 Hz, and is then sent to the sampling unit C. In the sampling unit C, edge sampling and decision are performed on the 40-time multiplied base frequency clock provided by the frequency multiplier, and the results are sent to the counter for the addition operation. The 40-times multiplied base frequency clock provided by the frequency multiplier is $40*d*F_{clk}$=1000000080 Hz, is sent to the accumulator for accumulation in a single accumulation mode. When the accumulated value equals to $2^N$, the counter of the subsequent stage is latched and cleared. Accordingly, the $2^N$ accumulator is also cleared and the accumulation is restarted. Every moment the accumulated value of the $2^N$ accumulator reaches $2^N$, the value latched by the counter is the frequency control word of the diverse-sourced clock C $K_C$ at the current moment, and the calculation formula is:

$$\left|\frac{C_{freqC}}{C_{x*fclk}}\right| = \left|\frac{K_c}{2^N}\right|;$$

In the above formula, $C_{freqC}$ represents the clock frequency of the diverse-sourced clock C, and $C_{x*fclk}$ represents the clock frequency of the multiplied base frequency clock.

For example, in case that N=32, when the accumulated value of the accumulator reaches 4294967296 times of 40-time multiplied base frequency clock, the counter will latch the frequency control word $|K_C|\approx 83494196$ and transfer the frequency control word to the calculation and filtering unit.

It should be noted that in this embodiment, N takes the value of 32 for the $2^N$ accumulator by way of an example for illustration of the frequency combination, while N may also take any number such as 8, 16, 32, 48, 64, etc. Within a certain threshold, the larger the value of N is, the longer it takes to determine the frequency control word, and the more accurate the result is. Those having ordinary skills in the art may alter the value of N according to the error and accuracy of the system, and it is not intended to limit the value of N in the embodiments of the present disclosure.

Since the above $K_A$, $K_B$, $K_C$ are real-time frequency control words respectively generated by sampling unit A, sampling unit B and sampling unit C, and which are rounded frequency control words with the integer part kept, and in order to further reduce the error and jitter, the real-time frequency control words $K_A$, $K_B$, $K_C$ obtained by sampling unit A, sampling unit B and sampling unit C are sent to the calculation and filtering unit. The calculation and filtering unit is configured to filter the real-time frequency control words $K_A$, $K_B$, $K_C$.

In this embodiment, mean filtering is performed with the formula:

$$K = \frac{K_1 + K_2 \ldots\ldots K_M}{M};$$

the above formula indicates that the M frequency control words will be added together in the sampling unit, and the filtering will be achieved by the average value of the M frequency control words. The accuracy of filtering depends on the value of M.

Through the average calculation as described above, the calculated and filtered three type of non-homologous frequency control words with one decimal are $K_A'=68728061.2$, $K_B'=42949686.7$ and $K_C'=83494196.2$ respectively.

The filtered frequency control words $K_A$, $K_B$, $K_C$ are sent to the PWM coding unit that is configured to respectively envelop the three frequency control words $K_A$, $K_B$, $K_C$ into the coded and combined PWM carrier by a frame, based on the base frequency clock $F_{clk}$. The framing can be referred to FIG. 14, the frame is formed in such a manner that, 0001 represents the header of frequency control word A, which is followed by frequency control word A; 0010 represents the header of frequency control word B, which is followed by frequency control word B; 0011 represents the header of frequency control word C, which is followed by frequency control word C; and 1111 represents the header D of the configuration information. Following the headers is the basic information accompanying the frame, such as multiples of frequency multiplication unit, the number of sampling times of the sampling unit, or the like, and which is followed by the CRC bits.

It should be noted that, a header of the frame as described above may be placed before a frequency control word or after a frequency control word. Similarly, the headers 0001-1111 are shown by way of an example for illustration of how the frame is formed, which do not necessarily implicitly indicate any specific content or whether the headers are encrypted. Those having ordinary skills in the art may modify and encrypt the headers as desired, and it is not intended to limit the position, the form and the content of the headers in the present disclosure.

The PWM coding unit can perform coding and combination through duty modulation as shown in FIG. 15, with an 80% duty ratio representing "0", a 20% duty ratio representing "1", or a 30% duty ratio representing "0" and a 70% duty ratio representing "1", and it is not intended to limit this in the present disclosure.

It should be noted that duty cycle modulation is shown by way of an example in this embodiment for illustration of how the coding and frequency combination is performed, and those having ordinary skills in the art may utilize various methods for coding, such as the Manchester coding, the 8B/10B coding, or the like, for coding the PWM wave, and it is not intended to limit how the coding is performed in the present disclosure.

Once the coding is completed by the PWM coding unit completes, the frequency control word A, frequency control word B and frequency control word C are coded and combined into the PWM carrier. The coded and combined PWM carrier transmits the signal to the receiving module through a single transmission link. It is to be noted that, the single transmission link may be a PCB trace, a connector, an optical fiber, a differential line, a link with a combination of various physical media, etc., and it is not intended to limit this in the present disclosure.

The PWM carrier transmitted via the single transmission link, once received by the receiving module, is sent to the PWM decoding unit for decoding. The frame headers are identified and decoded such that the frequency control words $K_A$, $K_B$, $K_C$ and the multiple of the frequency multiplication unit are obtained respectively. The $K_A$, $K_B$, $K_C$ are sent to the recovery unit A, recovery unit B and recovery unit C respectively. Each transmitted frequency multiple is written into the frequency demultiplication unit at the subsequent stage of the recovery unit. The frequency multiple of $d*F_{clk}$ is sent to the frequency multiplication unit of the receiving module. The PWM decoding unit physically recovers the base frequency clock $d*F_{clk}=25000002$ Hz from the PWM carrier, and which is subject to a 2500-time frequency demultiplication, and is output to the receiving module as the first receiving clock. In addition, in receiving module, the base frequency clock $d*F_{clk}$ is introduced to the frequency multiplication unit.

The frequency multiplication unit of the receiving module sets the same multiple as that of the sending module, and multiplies the frequency of the input base frequency clock $d*F_{clk}$ by 40 times to be $40*d*F_{clk}=1000000080$ Hz. The 40-time multiplied base frequency clock is sent to recovery unit A, recovery unit B and recovery unit C as the reference clock of each recovery unit.

The filtered diverse-sourced clock frequency control word $K_A'$ is introduced into the recovery unit A, and the 40-time multiplied base frequency clock provided by the frequency multiplier serves as a reference clock, $K_A'$ serves as an accumulation number for accumulation, the maximum value of the accumulator is $2^N$, and according to the following formula, $$F_{reqA} = \frac{F_{clk*x} * K_A'}{2^N};$$

a calculation is performed based on N=32 in this embodiment, and addresses for a local ROM table are generated by successive accumulation. The local ROM table stores addresses corresponding to square waves with values of "1" and "0". When the duty cycle of the output clock is to be 50%, the data corresponding to the first half address of the ROM is "1" and the data corresponding to the second half address is "0".

The actual diverse-sourced clock frequency obtained by looking up the addresses output by the accumulator is $F_{reqA}$=16002000.006438441574573516845703 hz which passes through the subsequent frequency demultipler which has a frequency demultiple that matches the 2000-time frequency multiple of the original sending module, and a signal having a frequency of 8001.0000032192207872867584228515 Hz is acquired after a 2000-time frequency demultiplication, which has a deviation of 0.402 ppb from the frequency of 8001 Hz of the original diverse-sourced clock A.

Similarly, the filtered diverse-sourced clock frequency control word $K_B'$ is introduced into the recovery unit B, and the 40-time multiplied base frequency clock provided by the frequency multiplier serves as a reference clock, $K_B'$ serves as an accumulation number for accumulation, the maximum value of the accumulator is $2^N$, and according to the following formula, $$F_{reqB} = \frac{F_{clk^*x} * K_B'}{2^N};$$

a calculation is performed based on N=32 in this embodiment, and addresses for a local ROM table are generated by successive accumulations. The local ROM table stores addresses corresponding to square waves with values of "1" and "0". When the duty cycle of the output clock is to be 50%, the data corresponding to the first half address of the ROM is "1" and the data corresponding to the second half address is "0".

The actual diverse-sourced clock frequency obtained by correspondence of the outputs from the accumulator with the addresses in the table is $F_{reqB}$=10000003.999093299731612205505371 hz, and since no multiplication is performed in the sending module, and no processing is performed by the subsequent frequency demultiplier, such that the generated diverse-sourced clock has a deviation of 0.09 ppb from the 10000004 Hz corresponding to the original diverse-sourced clock B.

Similarly, the filtered diverse-sourced clock frequency control word $K_C'$ is introduced into the recovery unit B, and the 40-time multiplied base frequency clock provided by the frequency multiplier serves as a reference clock, $K_C'$ serves as an accumulation number for accumulation, the maximum value of the accumulator is $2^N$, and according to the following formula, $$F_{reqC} = \frac{F_{clk^*x} * K_C'}{2^N};$$

a calculation is performed based on N=32 in this embodiment, and addresses for a local ROM table are generated by successive accumulations. The local ROM table stores addresses corresponding to square waves with values of "1" and "0". When the duty cycle of the output clock is to be 50%, the data corresponding to the first half address of the ROM is "1" and the data corresponding to the second half address is "0".

The actual diverse-sourced clock frequency obtained by correspondence of the outputs from the accumulator with the addresses in the table is $F_{reqC}$=19440008.99780907109379768371582 hz, which passes through the subsequent frequency demultiplier with a 3 time frequency demultiple matched with the 3 time frequency multiple of the original sending module, and a signal of 6480002.999269696903645992279052734 Hz is generated, with a deviation of 0.11 ppb from the 6480003 Hz corresponding to the original diverse-sourced clock C.

It should be noted that the duty cycle of 50% is shown by way of an example for illustration of the determination of the local ROM table addresses, and those having ordinary skills in the art may modify the proportion and sequence of "1" and "0" corresponding to the addresses according to the practical duty cycle requirements, and it is not intended to limit this in the present disclosure. Similarly, the deviations as described above are the deviations between the recovered diverse-sourced clocks in this embodiment and the original diverse-sourced clocks of the sending module, and which are shown by way of an example merely. In practical applications, the deviations as described above may depend on several factors such as the value of N for the accumulator, the filtering capability of the filter, and the depth of the local ROM table, etc. For example, the deviations may be reduced with the increase in the value of N, or may be reduced with the improvement of the filtering capability of the filter. Those having ordinary skills in the art may control or adjust the deviations as desired.

Figure 18:
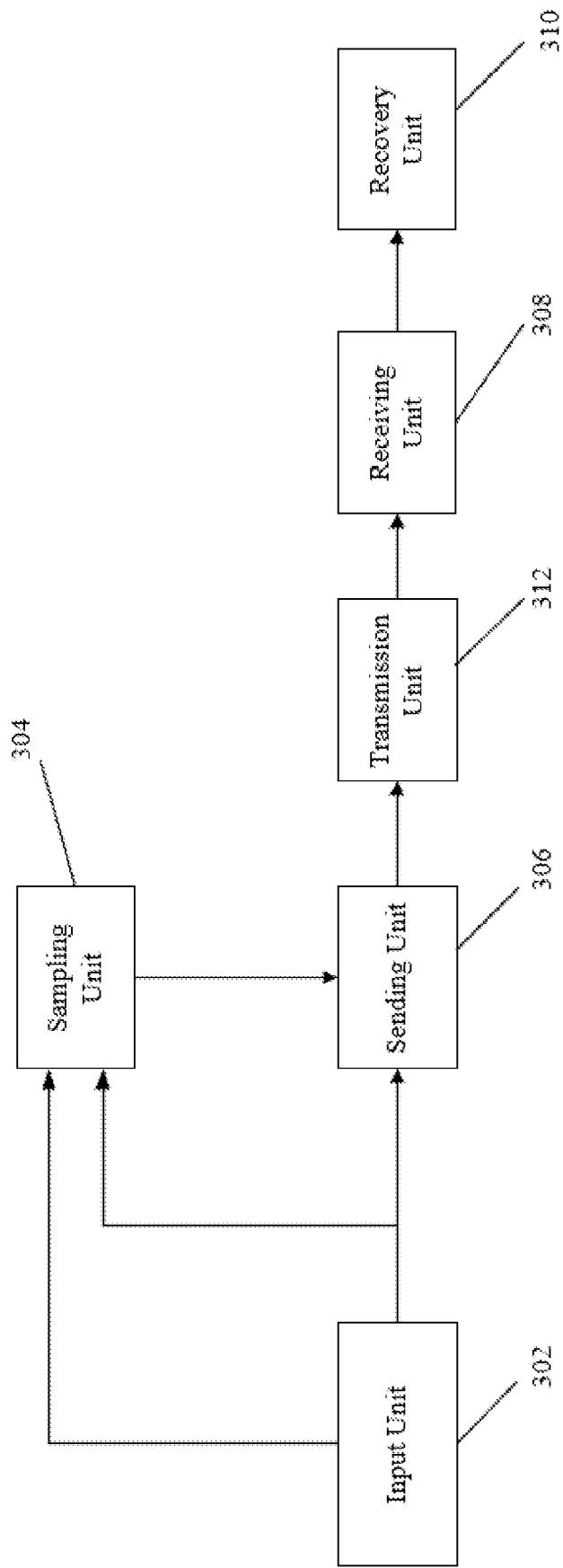
FIG. 18 depicts a schematic diagram showing the clock transmission system according to an embodiment of the present disclosure.

An embodiment of the present disclosure further provides a clock transmission system, and FIG. 18 depicts a schematic diagram showing the clock transmission system according to the embodiment of the present disclosure. As shown in FIG. 18, the clock transmission system in the embodiment of the present disclosure includes an input unit 302, a sampling unit 304, a sending unit 306, a receiving unit 308, and a recovery unit 310.

The input unit 302 is configured to input a first input clock and a second input clock.

The sampling unit 304 is configured to acquire a first sampling clock and a second sampling clock, and determine a first frequency control word according to the first sampling clock and the second sampling clock; in which the first frequency control word is indicative of the relationship between the first sampling clock and the second sampling clock, the first sampling clock is determined by the first input clock according to a preset rule, and the second sampling clock is determined by the second input clock according to a preset rule.

The sending unit 306 is configured to generate a clock signal according to the first input clock and send the clock signal to the receiving side, in which the clock signal carries at least the first frequency control word.

The receiving unit 308 is configured to receive a clock signal and determine a first input clock and a first frequency control word according to the clock signal.

The recovery unit 310 is configured to determine the second input clock according to the first input clock and the first frequency control word.

It should be noted that the input unit, sampling unit and sending unit in the clock transmission system of an embodiment of the present disclosure constitute the corresponding units in the apparatus for sending a clock of an embodiment of the present disclosure, and correspondingly, the receiving unit and recovery unit in the clock transmission system of an embodiment of the present disclosure are the corresponding units in the apparatus for receiving a clock of an embodiment of the present disclosure. Therefore, the clock transmission system in an embodiment of the present disclosure may be composed of a clock sending apparatus and a clock receiving apparatus in the respective embodiment of the present disclosure. The rest of the features and technical implementations that are not described, of the sending side of the clock transmission system in this embodiment correspond to the clock sending apparatus in the respective embodiment, and the rest of the features and technical implementations, that are not described, of the receiving side of the clock transmission system in this embodiment correspond to the clock receiving apparatus in the respective embodiment, which will not be repeated here for brief.

In an embodiment, the clock transmission system in the embodiment of the present disclosure further includes a line unit 312, which is arranged between the sending unit and the receiving unit, and the line unit is configured to transmit the clock signal to the receiving unit through the same line.

It should be noted that the line unit in this embodiment of the present disclosure establishes a physical link between the sending unit and the receiving unit in the clock transmission system, and the physical link established by the line unit is a single link, so that several input clocks of the sending side can be sent to the receiving side via the same line.

Figure 19:
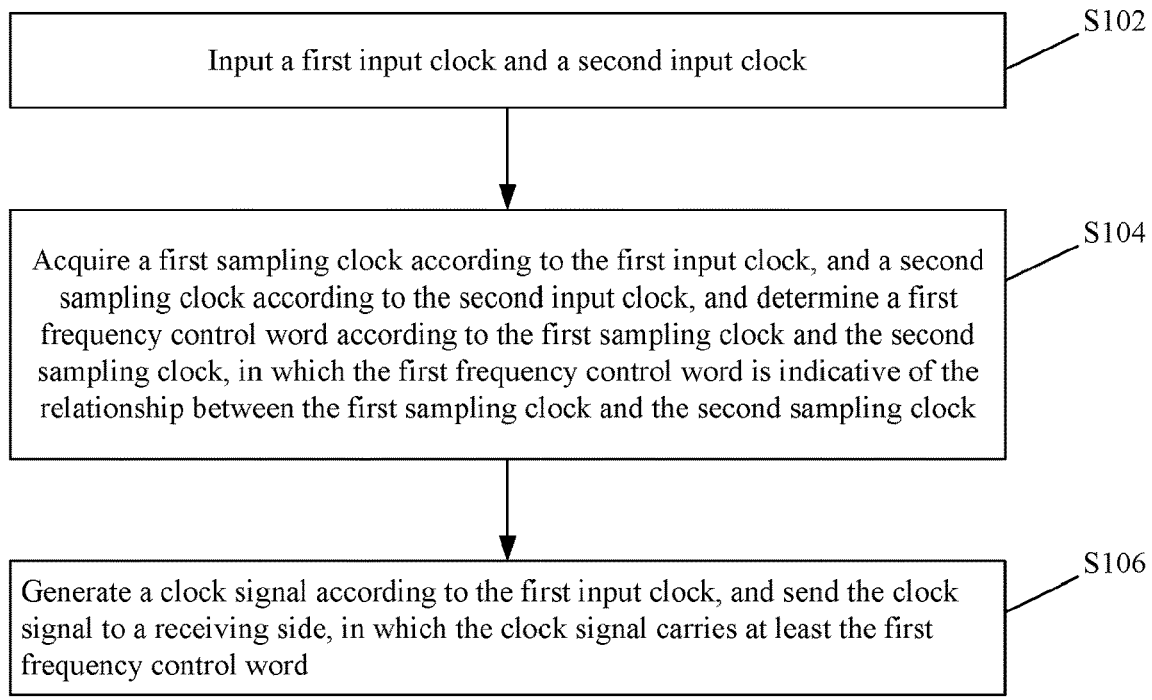
FIG. 19 depicts a flowchart showing the method for sending a clock according to an embodiment of the present disclosure.

An embodiment of the present disclosure further provides a method for sending a clock, which is performed by a sending side, and FIG. 19 depicts a flowchart showing the method for sending a clock according to the embodiment of the present disclosure. As shown in FIG. 19, the method for sending a clock in the embodiment of the present disclosure includes the following operations.

At S102, a first input clock and a second input clock are input.

At S104, a first sampling clock is acquired according to the first input clock, a second sampling clock is acquired according to the second input clock, and a first frequency control word is determined according to the first sampling clock and the second sampling clock, in which the first frequency control word is indicative of the relationship between the first sampling clock and the second sampling clock.

At S106, a clock signal is generated according to the first input clock, and the clock signal is sent to a receiving side, in which the clock signal carries at least the first frequency control word.

It should be noted that the other embodiments and technical implementations of the method for sending a clock in the embodiment of the present disclosure correspond to the apparatus for sending a clock in the above embodiments of the present disclosure, and which will not be repeated here.

In an embodiment, the first frequency control word is indicative of at least one of, a ratio of the clock frequency of the first sampling clock to that of the second sampling clock, or a difference between the clock frequency of the first sampling clock and that of the second sampling clock.

In an embodiment, in the above S104, determining of the first frequency control word according to the first sampling clock and the second sampling clock includes the following operation.

Respectively sampling the clock frequency of the first sampling clock and the clock frequency of the second sampling clock to determine the first frequency control word.

In an embodiment, sampling of the clock frequency of the first sampling clock and the clock frequency of the second sampling clock to determine the first frequency control word includes the following operations.

Accumulating the clock edges of the first sampling clock.

Performing a decision on clock edges of the second sampling clock, and counting the clock edges of the second sampling clock according to the decision.

And determining a counted number of the clock edges of the second sampling clock in response to the accumulated clock edges of the first sampling clock reaching a preset value, so as to obtain the first frequency control word.

In an embodiment, in the above S104, obtaining of the first sampling clock according to the first input clock includes the following operation.

Performing a frequency multiplication to the first input clock according to a preset first multiple to generate a first sampling clock, in which a ratio of a clock frequency of the first sampling clock to that of the second sampling clock is within a preset range.

In an embodiment, performing of the frequency multiplication of the first input clock according to the preset first multiple to generate the first sampling clock further includes the following operations.

Performing a frequency multiplication to the first input clock according to a preset second multiple, to generate a first sending clock for generating the clock signal.

And performing a frequency multiplication to the first sending clock according to a preset third multiple to generate the first sampling clock.

In an embodiment, in the above S104, generating of the second sampling clock according to the second input clock includes the following operation.

Performing a frequency multiplication to the second input clock according to a preset fourth multiple to generate the second sampling clock.

In an embodiment, the clock signal further carries a first multiple, a second multiple, a third multiple and a fourth multiple.

In an embodiment, in the above S106, generating of the clock signal according to the first input clock and sending of the clock signal to the receiving side, further includes the following operations.

Filtering the first frequency control word according to a preset filtering method.

And generating a clock signal according to the first input clock, and sending the clock signal to a receiving side, in which the clock signal carries at least the filtered first frequency control word.

In an embodiment, in the above S104, determining of the first frequency control word according to the first sampling clock and the second sampling clock further includes the following operations.

Obtaining a plurality of first frequency control words by a repeated operation of, determining the first frequency control words according to the first sampling clock and the second sampling clock.

And filtering of the first frequency control words according to a preset filtering method, includes, taking an average value of a plurality of first frequency control words as the filtered first frequency control word.

In an embodiment, in the above S106, generating of the clock signal according to the first input clock includes the following operation.

Encoding the first input clock to generate the clock signal, and enveloping the first frequency control word in the clock signal, in which, the clock frequency of the clock signal is identical to the clock frequency of the first input clock.

In an embodiment, the method for sending a clock in the embodiment of the present disclosure further includes the following operations.

Inputting a first input clock, a second input clock, and a third input clock.

Determining a first frequency control word according to a first sampling clock and a second sampling clock.

Acquiring a third sampling clock according to a third input clock, and determining a second frequency control word according to the first sampling clock and the third sampling clock, in which the second frequency control word is indicative of a relationship between the first sampling clock and the third sampling clock.

And generating a clock signal according to the first input clock, and sending the clock signal to the receiving side, in which the clock signal carries at least a first frequency control word and a second frequency control word.

In an embodiment, the frequency source of the first input clock is different from that of the second input clock.

From the description of the above embodiments, it is apparent to a person having ordinary skills in the art that the method of the above embodiments can be implemented by means of software with necessary general hardware platform, or by hardware, of course, but in many cases, the former is the better practice. Based on this understanding, the technical solution of the present disclosure can be embodied in the form of software products, which are stored in a non-transitory storage medium (such as ROM/RAM, magnetic disk and optical disk) and include several instructions to cause a terminal device (which can be a mobile phone, a computer, a server or a network device, etc.) execute the methods described in various embodiments of the present disclosure.

Figure 20:
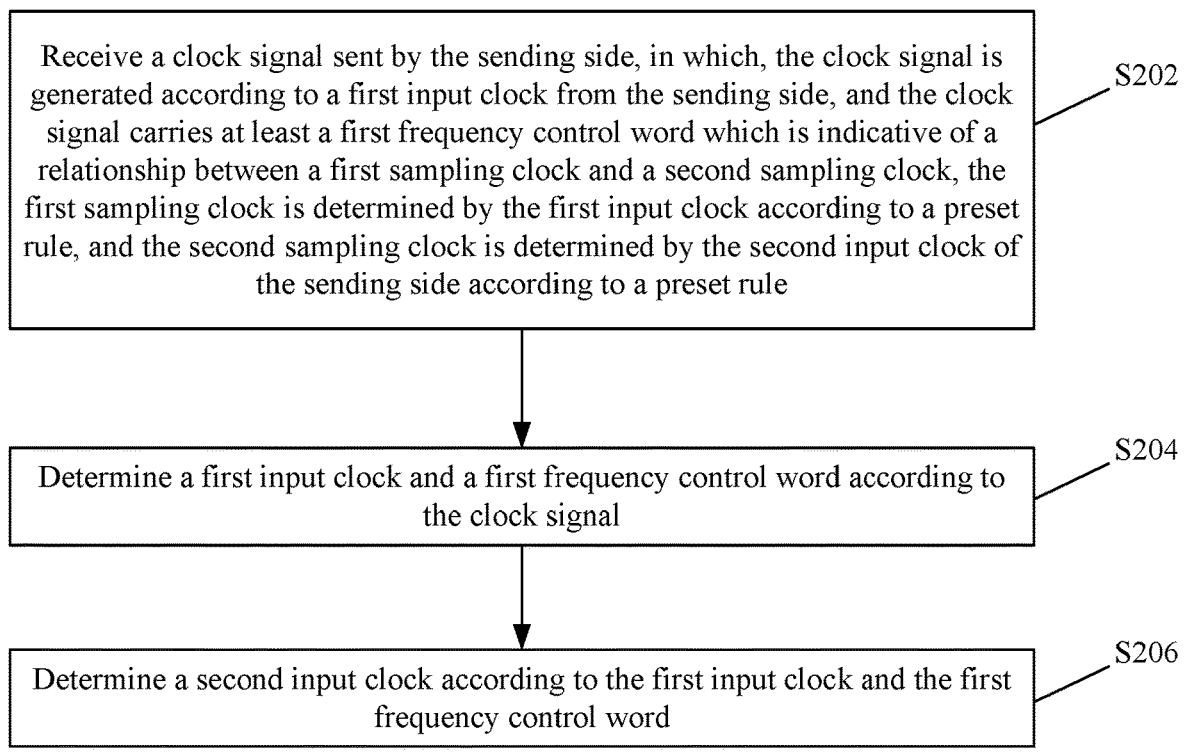
FIG. 20 depicts a flowchart showing the method for receiving a clock according to an embodiment of the present disclosure.

An embodiment of the present disclosure further provides a method for receiving a clock, which is performed by a receiving side, and FIG. 20 depicts a flowchart showing the method for receiving a clock according to the embodiment of the present disclosure. As shown in FIG. 20, the method for receiving a clock in the embodiment of the present disclosure includes the following operations.

At S202, a clock signal sent by the sending side is received, in which, the clock signal is generated according to a first input clock from the sending side, and the clock signal carries at least a first frequency control word which is indicative of a relationship between a first sampling clock and a second sampling clock, the first sampling clock is determined by the first input clock according to a preset rule, and the second sampling clock is determined by the second input clock of the sending side according to a preset rule.

At S204, a first input clock and a first frequency control word are determined according to the clock signal.

At S206, a second input clock is determined according to the first input clock and the first frequency control word.

It should be noted that the other embodiments and technical implementations of the method for receiving a clock in the embodiment of the present disclosure correspond to the apparatus for sending a clock in the above embodiments of the present disclosure, and which will not be repeated here.

In an embodiment, the above S206, determining of the second input clock according to the first input clock and the first frequency control word, includes the following operations.

Generating a first sampling clock according to a first input clock, and determining a plurality of first phase addresses according to the first sampling clock and a first frequency control word, in which each first phase address is indicative of a phase of the second sampling clock.

And determining a second sampling clock according to the plurality of first phase addresses, and determining the second input clock according to the second sampling clock.

In an embodiment, generating of a first sampling clock according to a first input clock, and determining of a plurality of first phase addresses according to the first sampling clock and a first frequency control word, includes the following operation.

Accumulating the first frequency control word according to the clock edges of the first sampling clock, and obtain a plurality of first phase addresses according to each accumulation result of the first frequency control word.

And determining of a second sampling clock according to a plurality of first phase addresses includes the following operations.

Acquiring a waveform of the second sampling clock according to the plurality of first phase addresses and a preset mapping relationship, in which the mapping relationship is indicative of the mapping relationship between the first phase addresses and the waveform parameters preset by the second sampling clock.

And determining the clock frequency of the second sampling clock according to the waveform of the second sampling clock.

In an embodiment, the waveform parameter is indicative of a parameter of a periodic waveform, in which the waveform parameter includes at least one of, an output level value of a square wave, an output level value of a sine wave, an output level value of a triangular wave, an output level value of a sawtooth wave, or an output level value of a pulse.

In an example where the waveform parameter is the output level value of the square wave, acquiring the waveform of the second sampling clock according to the first phase addresses and the preset mapping relationship, includes the following operation.

Performing a decision on each of the plurality of first phase addresses according to the mapping relationship, and acquiring the waveform of the second sampling clock according to the decision.

In an example where the waveform parameter is the output level value of the sine wave, acquiring the waveform of the second sampling clock according to the first phase addresses and the preset mapping relationship, includes the following operations.

Respectively obtaining a plurality of output level values of a sine wave each corresponding to a respective one of a plurality of first phase addresses according to the first phase addresses and the preset mapping relationship.

And performing digital-to-analog conversion on a plurality of output level values of the sine wave to obtain the waveform of the second sampling clock.

In an embodiment, the clock signal additionally carries a second frequency control word, which is indicative of the relationship between the first sampling clock, and the third sampling clock which is determined by the third input clock of the sending side according to a preset rule.

In the above circumstances, the method for receiving a clock in the embodiment of the present disclosure further includes the following operations.

Determining a second frequency control word according to the clock signal.

And determining a third input clock according to the first input clock and the second frequency control word.

From the description of the above embodiments, it is apparent to a person having ordinary skills in the art that the method of the above embodiments can be implemented by means of software with necessary general hardware platform, or by hardware, of course, but in many cases, the former is the better practice. Based on this understanding, the technical solution of the present disclosure can be embodied in the form of software products, which are stored in a non-transitory storage medium (such as ROM/RAM, magnetic disk and optical disk) and include several instructions to cause a terminal device (which can be a mobile phone, a computer, a server or a network device, etc.) execute the methods described in various embodiments of the present disclosure.

An embodiment of the present disclosure further provides a non-transitory computer-readable storage medium storing a computer program, which when executed by a processor, causes the processor to carry out the method in any of the above embodiments.

In an embodiment, the non-transitory computer-readable storage medium may include, but is not limited to, U disk, Read-Only Memory (ROM), Random Access Memory (RAM), portable hard disk, magnetic disk or optical disk, or other media that can store computer programs.

An embodiment of the present disclosure further provides an electronic device, which includes processor and a memory storing a computer program, which when executed by a processor, causes the processor to carry out the method in any of the above embodiments.

In an embodiment, the electronic device may further include a transmission device and an input-output device, in which the transmission device is connected with the processor, and the input-output device is connected with the processor.

By means of the embodiments of the present disclosure, during the transmission of the clock at the sending end, for the first and second input clocks to be sent, and input by the input unit, the first sampling clock is determined by the first input clock according to the preset rule and the second sampling clock determined by the second input clock according to the preset rule are acquired by the sampling unit, and the first frequency control word which is indicative of the relationship between the first sampling clock and the second sampling clock, is determined according to the first sampling clock and the second sampling clock. Further, the sending unit generates a clock signal carrying the first frequency control word according to the first input clock, and sends the clock signal to the receiving side; Therefore, the apparatus for sending a clock in the embodiment of the present disclosure can send the first input clock and the second input clock at the same time, and there is no restriction on whether the first input clock and the second input clock are homologous. Therefore, the embodiment of the present disclosure can address the issue of the complicated and ineffective layout of the clock lines for clock distribution in communication equipment in the art, which significantly simplifies the layout of clock lines for the clock distribution, thereby reducing the cost in backplane manufacturing.

The specific examples in this embodiment, can be referred to the examples described in the above embodiments, and which will not be repeated here.

It shall be apparent to those having ordinary skills in the art that the above modules or processes of the present disclosure can be implemented as a general-purpose computing device, which may be distributed in an integrated manner over a single computing device or distributed over a network composed of a plurality of computing devices, and which may be implemented as program codes executable by the computing device(s), thus which can be stored in a storage device and executed by the computing device(s). And in some cases, the processes shown or described may be performed in an order different than those shown or described. Alternatively, all or some of the processes may be embodied separately into individual integrated circuit modules. Therefore, the present disclosure is not limited to any specific combination of hardware and software.

While some embodiments of the present disclosure are described above, the present disclosure is not limited by those embodiments described. Various modifications and alternations can be made by those having ordinary skills in the art. Any modifications, equivalents, alternations, or improvements, made within the concepts of the present disclosure shall be included in the scope of protection of the present disclosure.

What is claimed is:

1. A method for sending a clock, performed by a sending side, the method comprising:
    inputting a first input clock and a second input clock;
    acquiring, a first sampling clock according to the first input clock, and a second sampling clock according to the second input clock, and determining a first frequency control word according to the first sampling clock and the second sampling clock,
    wherein the first frequency control word is indicative of the relationship between the first sampling clock and the second sampling clock; and
    generating a clock signal according to the first input clock, and sending the clock signal to a receiving side;
    wherein the clock signal carries at least the first frequency control word; and
    wherein sampling of the clock frequency of the first sampling clock and the clock frequency of the second sampling clock to determine the first frequency control word comprises:
    accumulating a clock edge of the first sampling clock;
    performing a decision on a clock edge of the second sampling clock, and accumulate the clock edge of the second sampling clock according to the decision of the clock edge; and
    determining a counted number of the clock edge of the second sampling clock in response to an accumulated value of the clock edge of the first sampling clock reaching a preset value, so as to generate the first frequency control word.

2. The method of claim 1, wherein, the first frequency control word is indicative of at least one of,
    a ratio of a clock frequency of the first sampling clock to a clock frequency of the second sampling clock, or
    a difference between the clock frequency of the first sampling clock and the clock frequency of the second sampling clock.

3. The method of claim 2, wherein determining of the first frequency control word according to the first sampling clock and the second sampling clock comprises:
    sampling the clock frequency of the first sampling clock and the clock frequency of the second sampling clock respectively, to determine the first frequency control word.

4. The method of claim 1, wherein acquiring of the first sampling clock according to the first input clock comprises:
    performing a frequency multiplication to the first input clock according to a preset first multiple to generate a first sampling clock, wherein a ratio of a clock frequency of the first sampling clock to a clock frequency of the second sampling clock is within a preset range.

5. The method of claim 4, wherein performing of the frequency multiplication to the first input clock according to a preset first multiple to generate the first sampling clock further comprises:
performing a frequency multiplication to the first input clock according to a preset second multiple, to generate a first sending clock for generating the clock signal; and
performing a frequency multiplication to the first sending clock according to a preset third multiple to generate the first sampling clock.

6. The method of claim 5, wherein acquiring of the second sampling clock according to the second input clock comprises:
performing a frequency multiplication to the second input clock according to a preset fourth multiple to generate the second sampling clock.

7. The method of claim 6, wherein the clock signal further carries the first multiple, the second multiple, the third multiple, and the fourth multiple.

8. The method of claim 1, wherein generating of a clock signal according to the first input clock and sending of the clock signal to the receiving side further comprises:
filtering the first frequency control word according to a preset filtering method; and
generating the clock signal according to the first input clock, and sending the clock signal to the receiving side;
wherein the clock signal carries the filtered first frequency control word.

9. The method of claim 8, wherein determining of the first frequency control word according to the first sampling clock and the second sampling clock further comprises:
obtaining a plurality of first frequency control words by a repeated operation of, determining a respective first frequency control word according to the first sampling clock and the second sampling clock; and
filtering of the first frequency control words according to a preset filtering method, comprises,
taking an average value of the plurality of first frequency control words as the filtered first frequency control word.

10. The method of claim 1, wherein generating of the clock signal according to the first input clock comprises:
encoding the first input clock to generate the clock signal, and
enveloping the first frequency control word in the clock signal, wherein,
clock frequency of the clock signal is identical to clock frequency of the first input clock.

11. The method of claim 1, further comprising:
inputting the first input clock, the second input clock, and a third input clock;
determining the first frequency control word according to the first sampling clock and the second sampling clock;
acquiring the third sampling clock according to the third input clock, and determining a second frequency control word according to the first sampling clock and the third sampling clock, wherein the second frequency control word is indicative of a relationship between the first sampling clock and the third sampling clock; and
generating the clock signal according to the first input clock, and sending the clock signal to the receiving side, wherein the clock signal carries at least the first frequency control word and the second frequency control word.

12. The method of claim 1, wherein a frequency source of the first input clock is different from a frequency source of the second input clock.

13. A method for receiving a clock, performed by a receiving side, the method comprising:
receiving a clock signal sent by a sending side,
wherein the clock signal is generated according to a first input clock from the sending side, and
the clock signal carries at least a first frequency control word which is indicative of a relationship between a first sampling clock and a second sampling clock,
the first sampling clock is determined by the first input clock according to a preset rule, and
the second sampling clock is determined by the second input clock of the sending side according to a preset rule;
determining the first input clock and the first frequency control word according to the clock signal; and
determining the second input clock according to the first input clock and the first frequency control word;
wherein determining of the second input clock according to the first input clock and the first frequency control word comprises:
acquiring a first sampling clock according to a first input clock, and
determining a plurality of first phase addresses according to the first sampling clock and a first frequency control word,
wherein each of the plurality of first phase addresses is indicative of a phase of the second sampling clock; and
determining the second sampling clock according to the plurality of first phase addresses, and determining the second input clock according to the second sampling clock.

14. The method of claim 13, wherein acquiring of the first sampling clock according to the first input clock and determining of a plurality of first phase addresses according to the first sampling clock and the first frequency control word comprises:
accumulating the first frequency control word according to a clock edge of the first sampling clock, and acquiring each of the plurality of first phase addresses according to a respective one accumulation result of the first frequency control word; and
determining of the second sampling clock according to the plurality of first phase addresses comprises,
acquiring a waveform of the second sampling clock according to the plurality of first phase addresses and a preset mapping relationship, wherein the mapping relationship is indicative of the mapping relationship between the first phase addresses and a waveform parameter preset by the second sampling clock; and
determining clock frequency of the second sampling clock according to the waveform of the second sampling clock.

15. The method of claim 14, wherein the waveform parameter is indicative of a parameter of a periodic waveform, and
wherein the waveform parameter comprises at least one of,
an output level value of a square wave,
an output level value of a sine wave, an output level value of a triangular wave,
an output level value of a sawtooth wave, or
an output level value of a pulse.

16. The method of claim 15, wherein in response to the waveform parameter being an output level value of a square wave, acquiring of the waveform of the second sampling clock according to the first phase addresses and the preset mapping relationship, comprises:
   performing a decision on each of a plurality of first phase addresses according to the mapping relationship, and
   acquire the waveform of the second sampling clock according to the decision.

17. The method of claim 15, wherein in response to the waveform parameter being an output level value of a sine wave, acquiring of the waveform of the second sampling clock according to the first phase addresses and the preset mapping relationship, comprises:
   respectively acquiring a plurality of output level values of a sine wave each corresponding to a respective one of a plurality of first phase addresses according to the first phase addresses and the preset mapping relationship; and
   performing a digital-to-analog conversion on each of a plurality of output level values of the sine wave to determine the waveform of the second sampling clock.

18. The method of claim 15, wherein the clock signal additionally carries a second frequency control word which is indicative of a relationship between the first sampling clock,
   and the third sampling clock which is determined by the third input clock of the sending side according to a preset rule; and
   the method further comprises:
   determining the second frequency control word according to the clock signal; and
   determining the third input clock according to the first input clock and the second frequency control word.

19. A non-transitory computer-readable storage medium, storing a computer program, which when executed by a processor, causes the processor to carry out a method for sending a clock, performed by a sending side, the method comprising:
   inputting a first input clock and a second input clock;
   acquiring, a first sampling clock according to the first input clock, and
   a second sampling clock according to the second input clock, and
   determining a first frequency control word according to the first sampling clock and the second sampling clock,
   wherein the first frequency control word is indicative of the relationship between the first sampling clock and the second sampling clock; and
   generating a clock signal according to the first input clock, and sending the clock signal to a receiving side;
   wherein the clock signal carries at least the first frequency control word; and
   wherein sampling of the clock frequency of the first sampling clock and the clock frequency of the second sampling clock to determine the first frequency control word comprises:
accumulating a clock edge of the first sampling clock;
performing a decision on a clock edge of the second sampling clock, and accumulate the clock edge of the second sampling clock according to the decision of the clock edge; and
determining a counted number of the clock edge of the second sampling clock in response to an accumulated value of the clock edge of the first sampling clock reaching a preset value, so as to generate the first frequency control word;
or the computer program, when executed by a processor, causes the processor to carry out a method for receiving a clock, performed by a receiving side, the method comprising:
receiving a clock signal sent by a sending side,
wherein the clock signal is generated according to a first input clock from the sending side, and
the clock signal carries at least a first frequency control word which is indicative of a relationship between a first sampling clock and a second sampling clock,
the first sampling clock is determined by the first input clock according to a preset rule, and
the second sampling clock is determined by the second input clock of the sending side according to a preset rule;
determining the first input clock and the first frequency control word according to the clock signal; and
determining the second input clock according to the first input clock and the first frequency control word;
wherein determining of the second input clock according to the first input clock and the first frequency control word comprises:
acquiring a first sampling clock according to a first input clock, and
determining a plurality of first phase addresses according to the first sampling clock and a first frequency control word,
wherein each of the plurality of first phase addresses is indicative of a phase of the second sampling clock; and
determining the second sampling clock according to the plurality of first phase addresses, and determining the second input clock according to the second sampling clock.

* * * * *

UNITED STATES PATENT AND TRADEMARK OFFICE
CERTIFICATE OF CORRECTION

| | | |
|---|---|---|
| PATENT NO. | : 12,273,112 B2 | Page 1 of 1 |
| APPLICATION NO. | : 17/904727 | |
| DATED | : April 8, 2025 | |
| INVENTOR(S) | : Boxiong Xu, Tongtong Guan and Fuqian Zeng | |

It is certified that error appears in the above-identified patent and that said Letters Patent is hereby corrected as shown below:

On the Title Page

The Left Column, Item (87), under "PCT Pub. Date:" reads:
"Oct. 30, 2021"

Should read:
"Dec. 30, 2021"

Signed and Sealed this
Fifth Day of August, 2025

Coke Morgan Stewart
*Acting Director of the United States Patent and Trademark Office*